(12) United States Patent
Tamaki et al.

(10) Patent No.: US 9,299,904 B2
(45) Date of Patent: Mar. 29, 2016

(54) LIGHT EMITTING DEVICE

(71) Applicant: NICHIA CORPORATION, Anan-shi, Tokushima (JP)

(72) Inventors: Hiroto Tamaki, Anan (JP); Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/716,535

(22) Filed: May 19, 2015

(65) Prior Publication Data

US 2015/0340578 A1 Nov. 26, 2015

(30) Foreign Application Priority Data

May 21, 2014 (JP) .................................. 2014-105131

(51) Int. Cl.
*H01L 33/00* (2010.01)
*H01L 33/62* (2010.01)
*H01L 33/48* (2010.01)

(52) U.S. Cl.
CPC .............. *H01L 33/62* (2013.01); *H01L 33/486* (2013.01)

(58) Field of Classification Search
CPC ...... H01L 33/486; H01L 33/50; H01L 33/502
USPC .......................................................... 257/98
See application file for complete search history.

(56) References Cited

U.S. PATENT DOCUMENTS

2009/0224268 A1* 9/2009 Tsuchiya .............. H01L 33/486
257/88
2010/0025722 A1 2/2010 Wada
2011/0079801 A1 4/2011 Zhang et al.
2011/0227103 A1 9/2011 Bogner et al.
2012/0213239 A1 8/2012 Ju et al.
2014/0008778 A1 1/2014 Zhang et al.

FOREIGN PATENT DOCUMENTS

| JP | 2000-196000 A | 7/2000 |
| JP | 2002-368279 A | 12/2002 |
| JP | 2008-147605 A | 6/2008 |
| JP | 2010-073734 A | 4/2010 |
| JP | 2010-258275 A | 11/2010 |
| JP | 2012-504318 A | 2/2012 |
| JP | 2013-506985 A | 2/2013 |
| JP | 2013-171912 A | 9/2013 |
| JP | 2014-107307 A | 6/2014 |

* cited by examiner

*Primary Examiner* — Hoai V Pham
(74) *Attorney, Agent, or Firm* — Global IP Counselors, LLP

(57) ABSTRACT

A light emitting device including; a base body having a base material that includes a first main face that has a lengthwise direction and a short-side direction that is perpendicular to the lengthwise direction, a second main face on the opposite side from the first main face, a first end face that extends in the lengthwise direction, and a second end face that extends in the short-side direction, and connection terminals that are provided on the first main face of the base material; and a light emitting element that is installed on the first main face and is connected to the connection terminals, the first end face of the base material has a recess that is contiguous with the first main face and the second end face and/or is contiguous with the second main face and the second end face, a length of the recess in a lengthwise direction is greater than a depth in a short-side direction, and the connection terminals are provided extending over the recess.

20 Claims, 7 Drawing Sheets

LIGHT EMITTING DEVICE

CROSS-REFERENCE TO RELATED APPLICATIONS

This application claims priority to Japanese Patent Application No. 2014-105131 filed on May 21, 2014. The entire disclosure of Japanese Patent Application No. 2014-105131 is hereby incorporated herein by reference.

BACKGROUND

1. Field of the Invention

The present disclosure relates to a light emitting device.

2. Description of Related Art

An LED module has been proposed in the past in which a solder fillet in the shape of a hollow quarter-cylinder was provided to the edge of a substrate on the top face of which was disposed a light emitting diode (LED) chip (see. JP 2012-504318 A, for example).

With this LED module, however, the solder fillet on the edges of the substrate caused the ends of the substrate to be thin, so there was a risk of cracking or chipping of the substrate. This problem was particularly pronounced when the LED module was flatter (thinner).

SUMMARY

An object of the present disclosure is to provide a light emitting device with which good soldering strength can be obtained while maintaining the mechanical strength of even a thin base body.

The light emitting device of the present disclosure includes a light emitting device having;

a base body having a base material that includes a first main face that has a lengthwise direction and a short-side direction that is perpendicular to the lengthwise direction, a second main face on the opposite side from the first main face, a first end face that extends in the lengthwise direction, and a second end face that extends in the short-side direction, and connection terminals that are provided on the first main face of the base material; and a light emitting element that is installed on the first main face and is connected to the connection terminals, the first end face of the base material has a recess that is contiguous with the first main face and the second end face and/or is contiguous with the second main face and the second end face, a length of the recess in a lengthwise direction is greater than a depth in a short-side direction, and the connection terminals are provided extending over the recess.

According to the light emitting device of the present disclosure, it is possible to provide a light emitting device with which good soldering strength can be obtained while maintaining the mechanical strength of even a thin base body.

DETAILED DESCRIPTION OF THE INVENTION

DETAILED DESCRIPTION

Figure 1A:
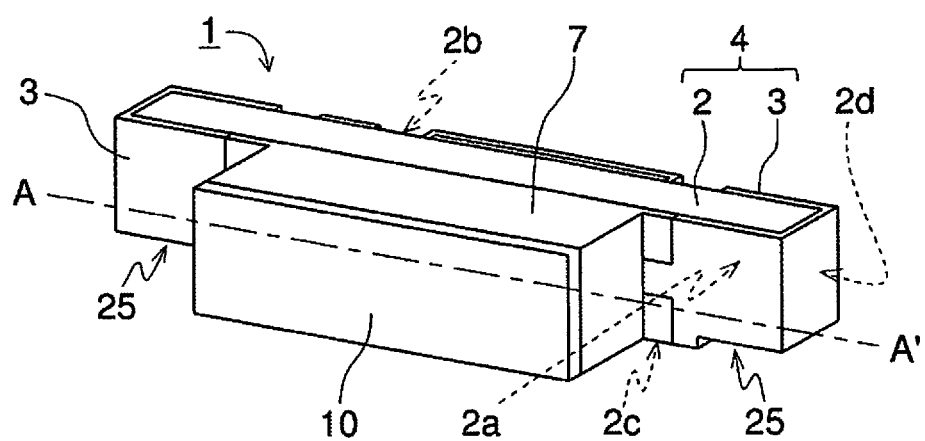
FIG. 1A is a simplified oblique view of the light emitting device in an embodiment of the present invention.

Embodiments for implementing the light emitting device of the present invention will be described below with reference to the accompanying drawings. In the following embodiment of the light emitting device that embody the technological concept of the present invention are just examples, and unless otherwise specified, the constituent parts discussed in the embodiments are not intended to limit the scope of the present invention. Further, constitutions described in examples and the embodiments can be employed in other examples and embodiments.

The sizes and the arrangement relationships of the members in each of drawings are occasionally shown exaggerated for ease of explanation.

The light emitting device in an embodiment of the present invention is a so-called side-view type of light emitting device in which the mounting face is a face adjacent to the light extraction face, but can also be applied to a light emitting device called a top-view type, in which the mounting face is the face opposite the light extraction face.

This light emitting device includes at least a base body equipped with a base material and a pair of connection terminals, a light emitting element, and preferably further includes a sealing member.

In this Specification, the light extraction face of the light emitting device will be called the top face, faces that intersect or are adjacent to the light extraction face will be called side faces, and one of the side faces will be called the mounting face of the light emitting device. Because of this, of the faces of the various members or elements constituting the light emitting device, there will be times when the face corresponding to the light extraction face of the light emitting device is called the first main face or front face (that is, the top face), the face on the opposite side from the first main face is called the second main face (that is, the bottom face), and the faces that intersect or are adjacent to the first main face and the second main face (that is, faces corresponding to the side faces of the light emitting device) are called end faces.

(Base Body)

The base body includes a base material, and a pair of connection terminals corresponding to the positive and the negative, on at least the first main surface of the base material. The shape of the base body is not particularly limited, and corresponds to the shape of the base material to be described below. For example, it is more preferred that at least the first main surface includes a long direction, and a short direction intersecting or orthogonally crossing the long direction.

The thickness of the base body can be according to a thickness of the base material to be described below. For example, the thickness of the thickest region is preferably about 500 µm or less, more preferably about 300 µm or less, further preferably about 200 µm or less. The thickness of the thickest region is preferably about 40 µm or more.

The strength of the base body can be adjusted according to a material of the base material to be described below, a material of the connection terminal, and so on. For example, within the above-described thickness range, the flexural strength is preferably 300 MPa or more, more preferably 400 MPa or more, further preferably 600 MPa or more. Accordingly, the strength of the light emitting device can be accordingly secured. The flexural strength here means a value measured by a three-point flexural test using a commercially available strength measuring apparatus, for example, from Instron Corporation.

When the base body is thin, and has a moderate strength as described above, a light emitting device which is small and thin and has high performance and high reliability is obtained.

(Base Material)

The base material may be formed of any material as long as it has a linear expansion coefficient within ±10 ppm/° C. of the linear expansion coefficient of the light emitting element to be described below. Preferably, the linear expansion coefficient of the base material falls within ±9 ppm/° C., ±8 ppm/° C., ±7 ppm/° C. or ±5 ppm/° C. of the linear expansion coefficient of the light emitting element. Accordingly, peeling of the light emitting element from the base body (connection terminal) or application of undesired stress to the light emitting element due to a difference in linear expansion coefficient between the light emitting element and the base body, which has been a problem heretofore, can be effectively prevented when the light emitting element is mounted on the base body. Accordingly, electrodes of the light emitting element can be directly connected to connection terminals of the base body by flip-chip mounting, so that a smaller and thinner light emitting device can be provided. In the present invention, the linear expansion coefficient means a value measured by the TMA method. One of $\alpha 1$ and $\alpha 2$ should satisfy this value, but it is more preferred that both $\alpha 1$ and $\alpha 2$ satisfy the value.

Examples of the base material include metals, ceramics, resins, dielectric materials, pulp, glass and paper or composite materials thereof (e.g. composite resins), or composite materials of the above-mentioned materials and conductive materials (e.g. metals, carbon etc.). Examples of the metal include copper, iron, nickel, chromium, aluminum, silver, gold and titanium or those including alloys thereof. Examples of the ceramic include aluminum oxide, aluminum nitride, zirconium oxide, zirconium nitride, titanium oxide and titanium nitride or those including mixtures thereof. Examples of the composite resin include glass epoxy resins.

Particularly, the base material is preferably one containing a resin. As the resin, any resin may be used as long as it is used in the art. Particularly, for ensuring that linear expansion coefficient of the base material falls within ±10 ppm/° C. of the linear expansion coefficient of the light emitting element, it is preferred to use a resin having a small linear expansion coefficient. Specific examples include epoxy resins, bismaleimide-triazine (BT) resins, polyimide resins, cyanate resins, polyvinyl acetal resins, phenoxy resins, acrylic resins, alkyd resins and urethane resins. For example, resins described in JP 2013-35960 A, WO 2011/132674, WO 2012/121224, WO 2012/165423 and the like, BT resins containing a naphthalene-based epoxy resin and compositions thereof, commercial products (e.g. Hl832NS and HL832NSF type LCA manufactured by Mitsubishi Gas Chemical Company, Inc.; MCL-E-700G and MCL-E-705G manufactured by Hitachi Chemical Company, Ltd.; and the like), and liquid crystal polymers described in JP 2010-114427 A and compositions thereof may be used. They may contain additives, monomers, oligomers, prepolymers and the like which are known in the art. Among those, BT resins or compositions thereof are preferred.

For example, the resin has a glass transition temperature of preferably about 250° C. or higher, more preferably about 270° C. or higher, about 280° C. or higher, about 300° C. or higher, about 320° C. or higher irrespective of the type of the resin. From a different point of view, the glass transition temperature is preferably equal to or higher than a melting temperature of a bonding member used for connecting the light emitting element to the connection terminal to be described below. The term "equal" herein means that a variation of about 5° C. is tolerated. Accordingly, defects such as a connection failure of the light emitting element can be avoided, without being affected by a temperature change in mounting of the light emitting element. As a result, the production yield of the light emitting device can be improved. The glass transition temperature may be measured by, for example, either a method in which a change in dynamic properties, heat absorption or heat generation is measured while the temperature of a sample is slowly elevated or lowered (TMA, DSC, DTA or the like), or a method in which a response of a dynamic viscoelasticity measurement sample is measured while the frequency of a periodic force applied to the sample is changed.

The resin has a heat emissivity of preferably 0.5 or more, more preferably 0.6 of more. When the resin has the above-mentioned heat emissivity, heat resulting from the light emitting element can be efficiently released, so that the life of the light emitting device can be improved. The heat emissivity means a value measured by an emissivity measurement device (e.g. TSS-5X manufactured by Japan Sensor Corporation).

For controlling the linear expansion coefficient or increasing the heat emissivity irrespective of the type of the resin, it is preferred that the resin contains a filler, for example a filler formed of an inorganic material. By appropriately combining the type and amount of the filler, the linear expansion coefficient of the base material can be adjusted.

Examples of the filler and inorganic material include borate particles covered with hexagonal boron nitride, alumina, silicas (natural silica, fused silica, etc.), metal hydrates (aluminum hydroxide, boehmite, magnesium hydroxide, etc.), molybdenum compounds (molybdenum oxide, etc.), zinc borate, zinc stannate, aluminum oxide, clay, kaolin, magnesium oxide, aluminum nitride, silicon nitride, talc, baked clay, baked kaolin, baked talc, mica, glass short fibers (glass fine powders such as those of E glass and D glass, glass cloths, etc.), hollow glass, heat-shrinkable fillers such as zirconium phosphate, rubber powders and core-shell type rubber powders (styrene-based, butadiene-based, acryl-based and silicone-based rubber powders, etc.).

Particularly, by including a large amount of filler or inorganic material having high heat conductivity, the heat emissivity can be adjusted. For example, when a glass cloth is used, an inorganic material in the glass cloth can be included in an amount of 50 wt % or more, 70 wt % or more, or 90 wt % or more.

A mounting surface (R in FIG. 2) that is a surface neighboring a light extraction surface (Q in FIG. 2) and a surface (S in FIG. 2) opposite to the mounting surface in a side view type light emitting device, the base material is preferably black. Accordingly, stray light associated with light emitted from the light emitting device or reflected light thereof can be absorbed. Further, by absorption of stray light of the base material or the base body, variations in color and/or brightness of light, etc. can be suppressed to improve quality in, for example, backlight applications. By absorption of stray light, photodegradation of peripheral members can be suppressed.

For adjusting the color of the base material, the resin may contain a pigment. Examples of the pigment include black carbon black and white titanium oxide. In a light emitting device having a small size, the light emitting element itself is relatively large with respect to the light emitting device, and therefore the light emitting device may excessively generate heat due to heat generation from the light emitting element, Stokes heat generation by a phosphor, or the like. Such heat may have adverse effects such as degradation and deformation of a light guide plate of a backlight. Thus, by including a black material having a large heat emissivity coefficient, such as carbon black, in the base material (resin), heat from the light emitting element and the phosphor can be released.

The linear expansion coefficient of the base material, depending on the type, a structure and the like of a light emitting element used, is, for example, preferably about 20 ppm/° C. or less, more preferably about 10 ppm/° C. or less, more preferably about 8 ppm/° C. or less, about 7 ppm/° C. or less, or about 6 ppm/° C. or less. When the base material has the above-mentioned linear expansion coefficient, the linear expansion coefficient of the base body itself can be controlled. Accordingly, as described below, even when flip-chip mounting of the light emitting element is performed, the light emitting element can be strongly connected to the base body despite a temperature change in the production process etc., so that defects such as a connection failure of the light emitting element can be avoided. As a result, the production yield of the light emitting device can be improved.

The shape, size, thickness and the like of the base material in one light emitting device are not particularly limited, and may be appropriately set. The thickness of the base material, depending on a material used, the type and a structure of the light emitting element placed, and the like, is, for example, preferably about 470 µm or less, more preferably about 370 µm or less, about 320 µm or less, about 270 µm or less, or about 200 µm or less, about 150 µm or less or about 100 µm or less. The thickness of the base material is preferably about 20 µm or more when considering the strength and so on. The flexural strength of the base material is preferably equal to the strength of the base body described above, for example 300 MPa or more, more preferably 400 MPa or more or 600 MPa or more for securing the strength of the overall base body.

The plane shape of the base material is, for example, a circle, a polygon such as a quadrangle, or a shape close thereto. Among those, a rectangle, i.e. a shape that is narrow and long in the long direction is preferred. The size is preferably larger than the later-described light emitting element in terms of a plane area. When one light emitting element is carried on one light emitting device, the length of the light emitting device in the long direction is preferably about 1.5 to 5 times, more preferably about 1.5 to 3 times of the length of one side of the light emitting element. The length of the light emitting device in the short direction is preferably about 1.0 to 2.0 times, more preferably about 1.1 to 1.5 times of the length of one side of the light emitting element. When a plurality of light emitting elements are carried on one light emitting device, the length of the light emitting device can be adjusted according to the number of the light emitting elements. For example, 2 or 3 light emitting elements are carried in the long direction, the length of the light emitting device in the long direction is preferably about 2.4 to 6.0 times or about 3.5 to 7.0 times of the length of one side of the light emitting element.

On the second main surface of the base material, one or more layers having functions of reinforcement, heat release, a mark for alignment and so on may be provided using an insulator, a metal and the like.

(Connection Terminal)

A pair of connection terminals may be formed on at least the first main surface of the base body. In this case, it is preferred that at least a part of the edge of the connection terminal coincides with a part of the edge of the first main surface of the base body. In other words, it is preferred that a part of the end face of the connection terminal and a part of the mounting surface of the base body are in the same plane. Accordingly, a mounting base body and the end face of the connection terminal can be brought into contact with (or made as closer as possible to) each other in mounting of the light emitting device on the mounting base body. As a result, the mountability of the light emitting device can be improved. Here, the same plane means that there is no or almost no step difference, and means that irregularities of several µm to several tens µm are tolerated. In the description of the present application, the same plane has the same meaning hereinafter.

The connection terminal has on the first main surface an element connection section connected to the electrode of the light emitting element and an external connection section connected to the outside of the light emitting device. It is preferred that the external connection section is provided on the second main surface of the base body in addition to the first main surface of the base body. For example, it is preferred that the connection terminal is (i) provided so as to extend from the first main surface onto a surface present between the first main surface and the second main surface, or (ii) provided so as to extend from the first main surface onto the second main surface through a via or a through-hole etc. provided so as to extend through the base material, or (iii) provided (e.g. in a U-shape in cross-sectional view) so as to extend from the first main surface onto the second main surface by passing over a surface present between the first main surface and the second main surface. Here, the surface present between the first main surface and the second main surface may refer to a part or the whole of one end face present between the first main surface and the second main surface, or may refer to a part or the whole of two or more end faces present between the first main surface and the second main surface. Usually, the element connection section is disposed on the first main surface, and the external connection section is disposed on (i) the first main surface, (ii) the first main surface and the end face, (iii) the first main surface, the end face and the second main surface, or (iv) the first main surface and the second main surface.

The connection terminal is not necessarily required to have the same width (e.g. length of the base body in the short direction) over the first main surface, the end face and/or the second main surface of the base body, and may be formed so as to be only partially reduced or increased in width. Alternatively, the connection terminal may be partially covered with an insulating material (e.g. base material) so as to be reduced in width at the first main surface and/or the second main surface of the base body. Such a width-reduced region is preferably disposed on at least the first main surface of the base body, and may be disposed on both the first main surface and the second main surface. Particularly, it is more preferred that the width-reduced region is disposed in the vicinity of the later-described sealing member when it is disposed on the first main surface of the base body.

By disposing such a width-reduced region, a situation can be suppressed in which a bonding member such as that to be described below, etc. which is connected to the connection terminal, or flux or the like contained therein penetrates to below the later-described sealing member and further to below the light emitting element along the surface of the terminal. By separating the element connection section from the end face of the base body extending along the long direction, penetration of the flux can be suppressed in the same manner as described above when the light emitting element is mounted.

The width-reduced region is smaller in width than the element connection section. The width-reduced region is preferably gently reduced in width.

The base body may have a heat releasing terminal, a heat sink, a reinforcement member and so on in addition to the connection terminal electrically connected to the light emitting element. They may be disposed on any of the first main surface, the second main surface and the end face, and in particular, preferably disposed below the light emitting element and/or the sealing member. The strength and reliability of the light emitting device can be accordingly enhanced. By enhancing the strength of the base body, distortion of the base body is reduced, so that moldability of the sealing member can be improved when the sealing member is molded using a metal mold. When the heat releasing terminal or reinforcement terminal is conductive, and is provided between a pair of connection terminals, it is preferred that the heat releasing terminal or reinforcement terminal is covered with an insulating film. Bridging of the bonding member with the connection terminal and the heat releasing terminal or reinforcement terminal can be accordingly prevented.

Further, when a plurality of light emitting elements are disposed in one light emitting device, the light emitting device may include one or more additional connection terminals for electrically connecting the plurality of light emitting elements. The shape, position and the like of the connection terminal can be appropriately set according to the number of light emitting elements mounted on one base body, and the arrangement and connection form (parallel or series) thereof, etc.

The connection terminal can be formed from, for example, a single-layer film or laminated film of Au, Pt, Pd, Rh, Ni, W, Mo, Cr, Ti, Fe, Cu, Al, Ag or an alloy thereof. Among those, one excellent in conductivity and mountability is preferred, and a material having good bondability and wettability with the bonding member on the mounting side is more preferred. Particularly, copper or a copper alloy is preferred from the viewpoint of heat releasability. A film having a high light reflectivity, such as a single-layer film or laminated film of silver, platinum, tin, gold, copper, rhodium or an alloy thereof may be formed on the surface of the connection terminal. Specific examples of the structure of the connection terminal include laminated structures such as W/Ni/Au, W/Ni/Pd/Au, W/NiCo/Pd/Au, Cu/Ni/Cu/Ni/Pd/Au, Cu/Ni/Pd/Au, Cu/Ni/Au, Cu/Ni/Ag and Cu/Ni/Au/Ag. The thickness or the number of layers may partially vary.

The connection terminals may each be substantially flat or have irregularities on a surface connected to the light emitting element, i.e. the first main surface. The connection terminals may each have a projection pattern at a position opposite to each of the electrodes of the light emitting element to be described below. Preferably, the projection pattern have a size comparable to that of the electrode of the light emitting element. Preferably, the connection terminal and the projection pattern are horizontal to a surface of the base body (surface connected to the light emitting element) so that the light emitting surface can be made horizontal when the light emitting element is carried on the base body. The projection pattern can be formed by, for example, an additive method, a semi-additive method or an etching method using photolithography such as a subtractive method.

For the connection terminal, a wire, a lead frame or the like may be used, but it is preferred to form a film of the above-described material by plating so that the connection terminal is substantially flat on the surface of the base body or forms the same plane with the base body. The thickness of the connection terminal is several μm to several tens μm. Particularly, it is preferred to form the projection pattern by laminating plating. The thickness of the projection pattern is several μm to several tens μm from the other region on the surface of the connection terminal.

As long as the linear expansion coefficient of the base material described above is not considerably impaired, the base body may itself form a protective element such as a capacitor, a varistor, a zener diode or a bridge diode, or may include a structure, which performs the function of these elements, as a part thereof in the form of, for example, a multilayer structure or a laminated structure. By using one that performs the above-mentioned element function, the base body can be made to function as a light emitting device without additionally carrying components. As a result, a high-performance light emitting device having improved electrostatic withstand voltage can be made smaller.

[Light Emitting Element]

The light emitting element is carried on the base body (i.e., a first main face in this embodiment), and connected to the connection terminal on the first main surface at the first main surface of the base body. One light emitting element, or a plurality of light emitting elements may be carried on one light emitting device. The size, shape and light emitting wavelength of the light emitting element can be appropriately selected. When a plurality of light emitting elements are carried, they may be disposed irregularly, or may be disposed regularly in the form of a base material or the like, or periodically. A plurality of light emitting elements may be connected in any form of series connection, parallel connection, series-parallel connection or parallel-series connection.

Preferably, the light emitting element include at least a nitride semiconductor laminate. The nitride semiconductor laminate is formed by laminating a first semiconductor layer (e.g. n-type semiconductor layer), a light emitting layer and a second semiconductor layer (e.g. p-type semiconductor layer) in this order, and contributes to light emission. The thickness of the nitride semiconductor laminate is preferably about 30 μm or less, more preferably about 15 μm or less or about 10 μm or less. Preferably, the nitride semiconductor laminate has, on the same surface (e.g. surface on the second semiconductor layer side), both a first electrode (positive or negative) electrically connected to the first semiconductor layer and a second electrode (negative or positive) electrically connected to the second semiconductor layer. An ohmic electrode, a metal film, an electrode for external connection, and so on are included as components that form the first electrode and the second electrode.

The type and the material of the first semiconductor layer, the light emitting layer and the second semiconductor layer are not particularly limited, and examples include various semiconductors such as group III-V compound semiconductors and group II-VI compound semiconductors. Specific examples include nitride-based semiconductor materials such as $In_XAl_YGa_{1-X-Y}N$ (0≤X, 0≤Y, X+Y<1), and InN, AlN, GaN, InGaN, AlGaN, InGaAlN and the like can be used. For the film thickness and the layer structure of each layer, those known in the art can be used.

The nitride semiconductor laminate is usually laminated on a growth substrate of a semiconductor layer. Examples of the growth substrate of a semiconductor layer include those capable of epitaxially growing a semiconductor layer. Examples of the material of the above-mentioned board include insulating boards such as those of sapphire ($Al_2O_3$) and spinel ($MgAl_2O_4$), and the above-described nitride-based semiconductor boards. The thickness of the board is preferably about 190 μm or less, more preferably about 180 μm or less or about 150 μm or less.

The board may have a plurality of projection portions or irregularities on a surface thereof. A surface of the nitride semiconductor laminate on the board side (surface opposite to a surface of the nitride semiconductor laminate on which the electrodes are disposed) may accordingly have a plurality of projection portions or irregularities. The irregularities originate from the shape of the board, and may have such a surface roughness that, for example, the height is about 0.5 to 2.0 μm, and the pitch is about 10 to 25 μm. The board may have an off angle of about 0 to 10° with respect to a predetermined crystal plane such as the C plane or the A plane. The board may have a semiconductor layer, an insulating layer or the like as an intermediate layer, a buffer layer, an under-layer or the like between the board and the first semiconductor layer.

The growth substrate of a semiconductor layer can be used for the light emitting device without being removed from the semiconductor laminate when a base body having light transmissivity, such as a sapphire base body is used. Alternatively, such a base body may be removed from the semiconductor laminate. The growth substrate can be removed using a laser lift-off method etc. Specifically, from the base body side, the semiconductor layer is irradiated with laser light (e.g. KrF excimer laser) that passes through the base body, so that a decomposition reaction is caused to occur at an interface between the semiconductor layer and the base body to remove the base body from the semiconductor layer. It is to be noted that the growth substrate may slightly remain at the end or the corner of the semiconductor layer besides the substrate completely removed from the semiconductor layer. A surface of the light emitting element in which the growth substrate of the semiconductor layer is removed (i.e., a surface opposite to a surface provided with an electrode of the semiconductor laminate) can be provided a concave portion. A depth of the concave portion may be about 0.5 to 2.0 μm on average. The growth substrate can be removed before or after the light emitting element is mounted on the base body.

When the nitride semiconductor laminate is freed of the growth substrate of a semiconductor layer, a light emitting device that is thinner and smaller can be obtained. By removing a layer that does not directly contribute to light emission, absorption of light emitted from the light emitting layer, which is caused by the above-mentioned layer, can be inhibited. Further, scattering of light caused by the base body can be inhibited. Accordingly, luminous efficiency can be further improved. As a result, the luminance can be enhanced. Also, the distance between the upper face of the light emitting element and a light guide plate can be reduced.

The light emitting element may have a laminated structure known as so called vertical dice or laminated dice, for example a laminated structure as described in JP 2008-300719 A or JP 2009-10280.

The shape of the light emitting element in plan view is not particularly limited, and is preferably a quadrangle or a shape very close thereto. Among those, a rectangular shape (particularly, an elongated rectangular shape) is more preferable. The upper limit of the size of light emitting elements can be appropriately adjusted according to a size of the light emitting device. The length of one side of the light emitting element is, for example, about hundred μm to 2 mm, and the size is preferably about 1400×200 μm, about 1100×200 μm or about 900×200 μm.

The light emitting element is preferably one having good linearity with no waves and burrs present on the side surface and the upper surface thereof. Accordingly, cracks of the light emitting element by minute external forces caused by these waves and burrs can be reduced. For example, the surface roughness Ra of the upper surface of the light emitting element is preferably 15 nm or less, for example about 10 to 15 nm. The surface roughness Ra of the side surface of the light emitting element is preferably 2 μm or less, more preferably 1.0 μm or less or 0.5 μm or less. Particularly, the surface roughness Ra of the side surface of the light emitting element is preferably 0.3 μm or less, more preferably 0.2 μm or less. The surface roughness Ra refers to a value obtained by a measurement method conforming to, for example, JIS B060, '01/ISO 4287 or the like.

(First Electrode and Second Electrode)

Preferably, the first electrode and the second electrode are formed on the same surface (a surface opposite to the substrate when the substrate exists) of the semiconductor laminate. Accordingly, flip-chip mounting can be performed with the positive and negative connection terminals of the base body made opposite to the first electrode and the second electrode of the light emitting element.

The first electrode and the second electrode can be formed from, for example, a single-layer film or laminated film of Au, Pt, Pd, Rh, Ni, W, Mo, Cr, Ti and the like or an alloy thereof. Specific examples include laminated films laminated like Ti/Rh/Au, W/Pt/Au, Rh/Pt/Au, W/Pt/Au, Ni/Pt/Au and Ti/Rh from the semiconductor layer side. The film thickness may be any film thickness of films that are used in the art.

In the first electrode and the second electrode, on sides close to the first semiconductor layer and the second semiconductor layer, respectively, it is preferred that each electrode is provided with, as a part of the electrode, a material layer having a higher reflectivity to light emitted from the light emitting layer as compared to other materials of the electrode. Examples of the high-reflectivity material include silver or silver alloys and aluminum. As the silver alloy, any of the materials known in the art may be used. The thickness of the material layer is not particularly limited, and examples include such a thickness that light emitted from the light emitting element can be effectively reflected, for example about 20 nm to 1 μm. The contact area of the high-reflectivity material layer with the first semiconductor layer or the second semiconductor layer is preferably as large as possible.

When silver or a silver alloy is used, it is preferred to form a covering layer that covers a surface (preferably the upper surface and the end face) of the material layer for preventing migration of silver. The above-mentioned covering layer should be one formed of a metal or an alloy that is usually used as a conductive material, and the covering layer is, for example, a single layer or a laminated layer containing aluminum, copper, nickel and the like. Among those, it is preferred to use AlCu. The thickness of the covering layer is several hundred nm to several μm for effectively preventing migration of silver.

As long as the first electrode and the second electrode are electrically connected to the first semiconductor layer and the second semiconductor layer, respectively, the entire surface of the electrode is not required to be in contact with the semiconductor layer, or the first electrode is not required to be situated wholly on the first semiconductor layer and/or the second electrode is not required to be situated wholly on the second semiconductor layer. That is, for example, the first electrode may be disposed on the second semiconductor layer or the second electrode may be disposed on the first semiconductor layer with an insulating film etc. interposed therebetween. Accordingly, the shape of the first electrode or the second electrode at a connection part with the element connection section can be easily changed, and the electrodes can be easily mounted on a pair of connection terminals.

The insulating film herein is not particularly limited, and may be any of the single-layer films and laminated films that are used in the art. By using an insulating film etc., the first electrode and the second electrode can be set at any size and position irrespective of a plane area of the first semiconductor layer and/or the second semiconductor layer.

The shape of each of the first electrode and the second electrode can be set according to a shape of the semiconductor laminate, a shape of the connection terminal (more specifically the element connection section) of the base body, or the like. Preferably, the first electrode, the second electrode and the element connection section each have a quadrangle shape in plan view or a shape close thereto. When the shape of each of the first electrode and the second electrode is substantially the same as the shape of the corresponding element connection section, bonding and registering of the semiconductor laminate with the base body can be easily performed by making use of a self-alignment effect. In this case, it is preferred that the plane shapes of the first electrode and the second electrode are substantially the same at least at the outermost surface of the semiconductor laminate connected to the base body. Preferably, the first electrode and the second electrode are disposed with the central part of the semiconductor laminate held therebetween.

The first main surface (surface opposite to the semiconductor layer) of each of the first electrode and the second electrode may have a step difference, but is preferably substantially flat. The term "flat" herein means that the height from the second main surface (surface opposite to the first main surface) of the semiconductor laminate to the first main surface of the first electrode is substantially the same as the height from the second main surface of the semiconductor laminate to the first main surface of the second electrode. The term "substantially the same" herein means that a variation of about ±10% in height of the semiconductor laminate is tolerated.

When the first main surface of each of the first electrode and the second electrode is made substantially flat, i.e. both the electrodes are disposed on substantially the same plane as described above, the light emitting element is easily mounted on the base body horizontally. Formation of the above-mentioned first electrode and second electrode can be performed by, for example, providing a metal film by plating etc., and then polishing or cutting the metal film to be flattened.

A DBR (distribution Bragg reflector) layer etc. may be disposed between the first electrode and the first semiconductor layer and between the second electrode and the second semiconductor layer within the bounds of not hindering electric connection between the electrode and the semiconductor layer. For example, the DBR has a multilayer structure in which a low-refractive-index layer and a high-refractive-index layer are laminated on an under-layer optionally including an oxide film etc., and the DBR selectively reflects light having a predetermined wavelength. Specifically, films having different refractive indexes are alternately laminated in a thickness of ¼ wavelength, accordingly light having a predetermined wavelength can be reflected with high efficiency. The DBR can be formed using as a material an oxide or a nitride of at least one selected from the group consisting of Si, Ti, Zr, Nb, Ta and Al.

The thickness of the light emitting element is preferably 200 μm or less, more preferably 180 μm or less or 150 μm or less as a thickness including the electrode irrespective of presence/absence of the growth substrate of a semiconductor. The thickness of only the nitride semiconductor laminate freed of the board is preferably 20 μm or less, more preferably 15 μm or less or 10 μm or less.

The light emitting element may have a reinforcement layer disposed on a surface of the nitrogen semiconductor laminate on which positive and negative electrodes are disposed. The reinforcement layer herein may be formed of any material selected from an insulator, a semiconductor and a conductor as long as it is a layer capable of reinforcing the strength of the nitride semiconductor laminate. The reinforcement layer may be either a single layer or laminated layer as a whole, or single layers or laminated layers disposed at a plurality of locations. The reinforcement layer may be a layer, a part of which secures insulation quality, conductivity and the like that are essential to the functions of the light emitting element. Particularly, some of films that are used for forming the light emitting element may be thickened. Specifically, conductive layers that function as electrodes etc. may be thickened by a known method such as plating or sputtering. An interlayer insulating film, a surface protective film and the like disposed these layers may be thickened. Accordingly, an increase in size of the light emitting device can be prevented with no additional layers disposed while a moderate strength is secured.

For example, from one point of view, a layer other than the nitride semiconductor laminate and positive and negative electrodes that form the light emitting element, and insulating layers that are optionally formed between these components for the purpose of electric insulation, protection and the like, the layer being on the base body side from the positive and negative electrodes, can be made to function as a reinforcement layer. From another point of view, minimum layers needed to function as the light emitting element can be thickened, and accordingly made to function as reinforcement layers. Further, layers additionally provided on these layers can be made to function as reinforcement layers. For these layers to function as reinforcement layers, the total volume of layers composed of metal materials is adjusted to be preferably about 5 to 95%, more preferably about 10 to 70% or about 15 to 50% based on the total volume of components other than the growth substrate of a semiconductor layer, such as a nitride semiconductor laminate, electrodes, an insulating protective film and a resin layer filling a gap between the electrodes. Further, from another point of view, a conductive layer that is not connected to electrodes of the light emitting element, an insulating layer for insulating the conductive layer from the electrodes, a protective layer for protecting the conductive layer, and a conductive layer, an insulating layer and a protective layer etc. for the above-mentioned layers can be made to function as reinforcement layers. The total thickness of these reinforcement layers at the thinnest region is preferably about 1 μm or more, more preferably about 3 μm or more, 5 μm or more, or 10 μm or more. By providing reinforcement layers having an appropriate thickness, an increase in size/thickness of the element can be minimized while the strength of the light emitting device is secured.

Preferably, the light emitting element is flip-chip-mounted on the base body. In this case, the first electrode and the second electrode are usually bonded to the connection terminals of the above-described base body by a bonding member or the bump or the like described above. For the bonding member, any of the materials known in the art can be used, and examples include conductive bonding members. Specific examples include tin-bismuth-based solder, tin-copper-based solder, tin-silver-based solder, gold-silver-based solder and the like (specifically, alloys having Ag, Cu and Sn as main components, alloys having Cu and Sn as main components, alloys having Bi and Sn as main components, and the like), eutectic alloys (alloys having Au and Sn as main components, alloys having Au and Si as main components, alloys having Au and Ge as main components, and the like), conductive pastes of silver, gold, palladium and the like, bumps, anisotropic conductive materials, and brazing materials such as low-melting-point metals. Of these, with the use of a solder, along with the shape of the above-described connection terminal, and the position and size of the projection pattern, a high-accuracy self-alignment effect can be exhibited. Accordingly, the light emitting element is easily mounted in the right place, so that mass productivity can be improved, and smaller light emitting devices can be produced. When the growth substrate is removed, it is preferred to use an anisotropic conductive paste or an anisotropic conductive film. When the light emitting element is fixed to the connection terminal, the bonding member is set to have a thickness that is preferably about ¼ to 3 times, more preferably about 1 to 3 times of the thickness of the nitride semiconductor laminate. Accordingly, a further high-accuracy self-alignment effect can be exhibited, so that the light emitting device can be made smaller and thinner. For example, the thickness of the bonding member is preferably about 2 to 50 μm, more preferably about 5 to 30 μm.

Sealing Member

The sealing member is a member having a function of sealing (covering) at least a part of the light emitting element or fixing the light emitting element to the base body. The material of the sealing member is not particularly limited, and examples include ceramics, resins, dielectric materials, pulp, glass and composite materials thereof. Among those, resins are preferred because they can be easily molded into any shape.

Examples of the resin include thermosetting resins, thermoplastic resins, modified resins thereof and hybrid resins at least one of these resins. Specific examples include resins such as epoxy resin compositions, modified epoxy resin compositions (silicone-modified epoxy resins etc.), silicone resin compositions, modified silicone resin compositions (epoxy-modified silicone resins etc.), hybrid silicone resins, polyimide resin compositions, modified polyimide resin compositions, polyamide resins, polyethylene terephthalate resins, polybutylene terephthalate resins, polycyclohexane terephthalate resins, polyphthalamide (PPA), polycarbonate resins, polyphenylene sulfide (PPS), liquid crystal polymers (LCP), ABS resins, phenol resins, acrylic resins, PBT resins, urea resins, BT resins and polyurethane resins.

The linear expansion coefficient and the glass transition temperature etc. of the resin used in the sealing member are not particularly limited, and for example, the linear expansion coefficient is preferably about 100 ppm/° C. or less, more preferably about 80 ppm/° C. or less or about 60 ppm/° C. or less, and the glass transition temperature is preferably about 100° C. or lower, more preferably about 75° C. or lower or 50° C. or lower.

The sealing member may be light transmissive, but is more preferably a light shielding material having a reflectivity of 60% or more, 70% or more, 80% or more or 90% or more to light from the light emitting element. Thus, it is preferred that the above-described material, e.g. a resin contains, for example, a light reflection material, a light scattering material, a colorant and the like such as titanium dioxide, silicon dioxide, zirconium dioxide, potassium titanate, alumina, aluminum nitride, boron nitride, mullite, niobium oxide, zinc oxide, barium sulfate, carbon black and various kinds of rare earth oxides (e.g. yttrium oxide and gadolinium oxide). The sealing member may contain a fibrous filler such as glass fibers or wollastonite, or an inorganic filler such as carbon. The sealing member may contain a material having high heat releasability (e.g. aluminum nitride etc.). Further, the sealing member may contain the later-described phosphor. Preferably, the sealing member contains these additives in an amount of, for example, about 10 to 95% by weight, 20 to 80% by weight or 30 to 60% by weight based on the total weight of the sealing member.

When the sealing member contains a light reflection material, light from the light emitting element can be efficiently reflected. Particularly, by using a material having a light reflectivity higher than that of the base body (for example, by using a silicone resin containing titanium dioxide as a sealing member when aluminum nitride is used for the base body), light extraction efficiency of the light emitting device can be enhanced by reducing the size of the base body while handling characteristics are retained. When the sealing member contains only titanium dioxide as a light reflection material, it contains the light reflection material in an amount of preferably about 20 to 60% by weight, more preferably 30 to 50% by weight based on the total weight of the sealing member.

When the light emitting device has a sealing member, the strength of the sealing member during a process such as removal or peeling of a growth substrate or a support of the semiconductor layer can be improved. Further, the strength of the whole light emitting device can be secured. By forming the sealing member from a material having high heat releasability, heat releasability can be improved while the light emitting device is kept small.

The outer shape of the sealing member is not particularly limited, and may be, for example, a cylindrical shape, a polygonal prism shape such as a quadrangular prism shape or a shape close thereto, a circular truncated cone shape, a polygonal truncated cone shape such as a quadrangular truncated cone shape, or a lens shape in part. Among those, the sealing member preferably has a shape that is narrow and long in the long direction of the base body. The sealing member preferably has a surface extending along the short direction of the base body.

The sealing member is preferably disposed in contact with a part or the whole of at least one side surface of the light emitting element so as to cover the side surface of the light emitting element, or preferably disposed in contact with the light emitting element so as to surround the entire periphery of the light emitting element. In this case, it is preferred that the sealing member is provided so as to be thin at the side surface (7a in FIG. 1C) extending in the long direction of the light emitting device, and thick at the side surface (7b in FIG. 1C) extending in the short direction of the light emitting device. The light emitting device can be accordingly made thinner. Preferably, the sealing member is provided so as to fill a gap between the mounted light emitting element and the base body. The strength of the light emitting device can be accordingly enhanced. The sealing member disposed between the light emitting element and the base body may be a material different from the material covering the side surface of the light emitting element. Accordingly, suitable functions can be imparted to the sealing member disposed on the side surface of the light emitting element and the member disposed between the light emitting element and the base body. For example, a material having a high reflectivity can be used for the sealing member disposed on the side surface of the light emitting element, and a material for strengthening adhesion between the light emitting element and the base body can be used for the member disposed between the light emitting element and the base body.

Particularly, the sealing member disposed between the light emitting element and the base body is preferably formed of a resin having a linear expansion coefficient within ±20% of the linear expansion coefficient of the connection terminal. From another point of view, the sealing member is formed of a resin having a linear expansion coefficient of preferably about 30 ppm/° C. or less, more preferably about 25 ppm/° C. or less. From still another point of view, the glass transition temperature is preferably 50° C. or lower, more preferably 0° C. or lower. The sealing member and the base body can be accordingly prevented from being peeled from each other.

An edge of the sealing member in plan view (plan view as seen from the light extraction surface side) may be disposed on the inside or outside from an edge of the base body. When the sealing member has a shape that is narrow and long in the long direction, one edge of the sealing member extending along the long direction preferably coincides with an edge of the base body extending along the long direction. That is, it is preferred that at least one of edges of the sealing member extending along the long direction forms the same plane with one of edges of the base body extending along the long direction, and it is more preferred that both edges of the sealing member form the same plane with both edges of the base body. Accordingly, the area of the light extraction surface can be increased, so that light extraction efficiency can be enhanced, without increasing the thickness of the light emitting device. An edge of the sealing member extending along the short direction is usually disposed on the inside from an edge of the base body extending along the short direction. The same plane herein not only means exactly the same, but also means that when the sealing member is slightly R-shaped, a part of the R shape is coincides with the end face of the base body.

The size of the sealing member is preferably larger than the light emitting element in terms of a plane area as seen from the light extraction surface side. Particularly, the length of the outermost shape of the sealing member in the long direction is preferably about 1.01 to 4.0 times of the length of one side of the light emitting element. Specifically, a length of about 300 to 2000 μm is preferred, and a length of about 1000 to 1500 μm is more preferred. The thickness of the sealing member (also referred to as a width from the end face of the light emitting element to the outermost shape of the sealing member as seen from the light extraction surface side, or a minimum width of the sealing member at the side surface of the light emitting element) is, for example, about 1 to 1000 μm, preferably about 50 to 500 μm or about 100 to 200 μm. Preferably, the sealing member has such a height that when the light emitting element is carried on the base body, the upper surface of the sealing member forms the same plane with the upper surface of the light emitting element. The sealing member can be formed by screen printing, potting, transfer molding, a compression molding or the like. When a molding machine is used, a mold release film may be used.

For sealing (covering) the whole of the side surface of the light emitting element, a surface of the light emitting element opposite to the base body, and so on, the sealing member is usually formed after the light emitting element is mounted on the base body. Further, the sealing member may be provided so as to cover the upper surface or the side surface of the light emitting element before the light emitting element is mounted on the base body.

A concave component or a through-hole may be formed in the base body, and this concave component or through-hole may be filled with part of the sealing member, so that the sealing member is latched to the base body. This improves adhesion between the sealing member and the base body, and prevents the sealing member from separating from the base body.

(Light Transmissive Member)

Preferably, the upper surface of the light emitting element, i.e. the light extraction surface of the light emitting device is provided with a light transmissive member. Preferably, the light transmissive member covers the upper surface of the sealing member when the side surface of the light emitting element is covered with the light shielding sealing member, and the upper surface of the light emitting element is not covered with the sealing member. The end face of the light transmissive member may be covered with or may be not covered with the sealing member.

The light transmissive member is preferably one permeable to 60% or more, further preferably 70%, 80% or 90% or more of light emitted from the light emitting layer. The light transmissive member may be a member similar to the sealing member, or may be a member different from the sealing member. Examples include resins such as silicone resins, silicone modified resins, epoxy resins, epoxy modified resins, phenol resins, polycarbonate resins, acrylic resins, TPX resins, polynorbornene resins, and hybrid resins containing at least one of these resins, and glass. Among those, silicone resins or epoxy resins are preferred, and silicone resins having excellent light resistance and heat resistance are more preferred.

The light transmissive member is preferably one containing a phosphor that is excited by light from the light emitting element. As the phosphor, one known in the art can be used. Examples include yttrium-aluminum-garnet (YAG)-based phosphors activated by cerium, lutetium-aluminum-garnet (LAG)-based phosphors activated by cerium, nitrogen-containing calcium aluminosilicate ($CaO-Al_2O_3-SiO_2$)-based phosphors activated by europium and/or chromium, silicate (($Sr, Ba)_2SiO_4$)-based phosphors activated by europium, β-sialon phosphors, nitride-based phosphors such as CASN-based or SCASN-based phosphors, KSF-based phosphors ($K_2SiF_6$:Mn) and sulfide-based phosphors. Accordingly, there can be provided a light emitting device that emits mixed-color light (e.g. white light) of primary light and secondary light having a visible wavelength, and a light emitting device that is excited by primary light of ultraviolet light to emit secondary light having a visible wavelength. When the light emitting device is used for a backlight of a liquid crystal display or the like, it is preferred to use a phosphor that is excited by blue light to emit red light (e.g. KSF-based phosphor) and a phosphor that emits green light (e.g. β-sialon phosphor). The color reproduction range of a display including a light emitting device can be accordingly broadened. When the light emitting device is used for illumination or the like, an element that emits bluish-green light can be used in combination with a red phosphor.

For example, the phosphor is preferably one having a central particle size of 50 μm or less, 30 μm or less or 10 μm or less. The central particle size can be measured and calculated using a commercially available particle measurement device, a particle size distribution measurement device, or the like. The above-mentioned particle size refers to a particle size obtained by an air permeability method in F.S.S.S.No (Fisher Sub Sieve Sizer's No). Particularly, when YAG or the like is used as a phosphor, the phosphor is preferably a bulk body (e.g. a plate-shaped body) obtained by uniformly dispersing and sintering ultrafine particles thereof. According to the above-mentioned form, high transparency can be secured by reducing voids and impurity layers as a single crystal structure and/or a polycrystalline structure.

The phosphor may be a luminescent material referred to as a so called nanocrystal or quantum dot. Examples of the material thereof include nano-size high-dispersive particles of semiconductor materials, for example group II-VI, group III-V and group IV-VI semiconductors, more specifically CdSe, core-shell type $CdS_xSe_{1-x}/ZnS$, GaP, InP, and GaAs. For example, such a phosphor has a particle size of about 1 to 20 nm (the number of atoms: about 10 to 50). By using such a phosphor, internal scattering can be suppressed, so that light transmittance can be further improved. By suppressing internal scattering, light components distributed in a direction perpendicular to the upper surface can be increased, and simultaneously light directed toward the side surface or the lower surface of the light emitting device can be suppressed, so that light extraction efficiency can be further improved. For example, when the light emitting device is applied to a backlight, efficiency of entrance of light to the backlight can be further enhanced. The quantum dot phosphor is unstable, and therefore may be surface-modified or stabilized with a resin such as PMMA (polymethyl methacrylate). This may be a bulk body (e.g. plate-shaped body) with the phosphor mixed with a transparent resin (e.g. an epoxy resin, a silicone resin or the like) and molded, or may be a plate-shaped body with the phosphor sealed between glass plates together with a transparent resin.

The light transmissive member is preferably a layered member in which a plurality of particle layers containing a particulate phosphor are laminated, a transparent polycrystalline phosphor plate member, or a transparent single crystal phosphor plate member. Accordingly, in the light transmissive member, scattering can be further reduced, so that light extraction efficiency etc. can be further improved. The light transmissive member such as a phosphor plate member and the light emitting element may be bonded by using a resin adhesive, or a direct bonding technique after cleaning and smoothing their surfaces.

The phosphor is not necessarily contained in the above-mentioned member, but may be provided at various positions or various members in the light emitting device. For example, the phosphor may be provided as a phosphor layer applied or bonded onto a light transmissive member which does not contain a phosphor.

The light transmissive member may contain a filler (e.g. a diffusing agent, a colorant or the like). Examples include silica, titanium oxide, zirconium oxide, magnesium oxide, glass, a crystal or sintered body of a phosphor, and a sintered body of a phosphor and an inorganic binding material. Optionally, the refractive index of the filler may be adjusted. The refractive index is, for example, 1.8 or more.

The shape of particles of the filler may be any of a granular shape, a spherical shape, a hollow shape and a porous shape. The average particle size (median size) of the particles is preferably about 0.08 to 10 μm at which a light scattering effect is obtained with high efficiency. The amount of the phosphor and/or the filler is, for example, preferably about 10 to 80% by weight based on the total weight of the light transmissive member.

Examples of the method for forming a light transmissive member include a method in which a light transmissive member is molded in the form of a sheet, and bonded by a hot melt method or by an adhesive, a method in which a phosphor is deposited by an electrophoretic deposition method, and then impregnated with a light transmissive resin, potting, compression molding, a spraying method, an electrostatic coating method and a printing method. At this time, silica (Aerosil) or the like may be added for adjusting the viscosity or fluidity. Among those, a spraying method, particularly a pulse spraying method of injecting spray pulsewise, i.e. intermittently is preferred when a phosphor is included in the light transmissive member. By injecting spray intermittently, the injection amount of the light transmissive member per unit time can be decreased. Thus, by moving a spray injection nozzle at a low speed while injecting spray in a small injection amount, a phosphor can be uniformly applied to a coating surface having an irregularity shape. In the pulse spraying method, the wind speed of air can be reduced without reducing the jetting speed of slurry from the nozzle as compared to a continuous spraying method. Thus, the slurry can be properly supplied to the coating surface, and the applied slurry is not disordered by an air stream. As a result, a coating film having high adhesion between phosphor particles and the surface of the light emitting can be formed. A plurality of laminated thin particle layers containing a particulate phosphor can be formed. By controlling the number of laminated layers in this way, thickness accuracy thereof can be improved. Deviation of the distribution of the phosphor can be suppressed, light subjected to uniform wavelength conversion can be emitted, and occurrence of color irregularity etc. of the light emitting element can be avoided.

The pulse spraying method is a known method described in, for example, JP 61-161175 A, JP 2003-300000 and WO 2013/038953, and the use material and conditions etc. thereof can be appropriately adjusted. For example, slurry to be applied contains a solvent, a thermosetting resin and a particulate phosphor. Examples of the thermosetting resin include silicone resins, epoxy resins and urea resins. As a solvent, an organic solvent such as n-hexane, n-heptane, toluene, acetone or isopropyl alcohol can be used. For example, the phosphor is used in an amount of preferably 10 to 80% by weight. The slurry is adjusted to have a viscosity of preferably about 0.01 to 1000 mPa·s, more preferably about 0.1 to 100 mPa·s.

The thickness of the light transmissive member is not particularly limited, and is, for example, about 1 to 300 μm, preferably about 1 to 100 μm, more preferably about 2 to 60 μm or about 5 to 40 μm. Particularly, when the light transmissive member is laminated by the spraying method, the thickness of the light transmissive member is preferably 20 times or less, more preferably 10 times or less, 6 times or less, 4 times or less or 3 times or less of the total thickness of the nitride semiconductor laminate. When the light transmissive member has the above-mentioned thickness, there can be provided a light emitting device that is smaller and thinner while wavelength conversion of light is sufficiently performed. From another point of view, the thickness of the light transmissive member is preferably 2 times or less of the thickness of the sealing member at the side surface of the light emitting element, more preferably 2 times or less of the minimum width, further preferably equal to or less than the minimum width. When the light transmissive member has a relatively small thickness as described above, light emitted from the light emitting element can be extracted only in one direction of the light extraction surface without being emitted from the end face (side surface) of the light transmissive member, irrespective of whether or not the light transmissive member is covered with the sealing member, as to be described below. Accordingly, light extraction efficiency can be improved.

Particularly, in backlight applications, a light transmissive member having a relatively small thickness as described above can further enhance luminous efficiency of the light emitting element and luminous efficiency of the backlight. For example, as described above, the ratio of side surface light to front surface light can be reduced, so that efficiency of entrance of light to a light guide plate of the backlight can be enhanced. Further, the resin amount can be decreased, and therefore the ratio of a transparent resin having a relatively low heat emissivity can be reduced, so that heat accumulation can be reduced. At the same time, the contact area between the light emitting element and the phosphor or between phosphors can be increased, and a heat transfer path can be secured. Accordingly, heat releasability can be improved to improve luminous efficiency. Further, the distance between the surface of the light emitting element and the entrance of light to the light guide plate can be minimized, and therefore light can be made to enter the light guide plate with a higher luminance, so that luminous efficiency in the backlight can be enhanced.

The upper surface (light extraction surface) of the light transmissive member may be a flat surface, or the upper surface (light extraction surface) and/or a surface in contact with the light emitting element may be an irregularity surface such as a convex surface or a concave surface to control distribution of light. When a plurality of particle layers containing a particulate phosphor are laminated as described above, irregularities corresponding to the particle size of the phosphor are passed to the surface of the light transmissive member. Thus, by laminating a thin light transmissive member containing a phosphor, the amount of resin can be reduced to obtain a moderate irregularity shape while aggregation of the phosphor is prevented and detachment of the phosphor is prevented. As a result, light extraction is effectively performed. That is, when considering discoloration or life and heat releasability of the light transmissive member, a resin-containing member such as the light transmissive member is preferably as thin as possible as long as the adhesive strength etc. can be retained. On the other hand, there is the concern of detachment of the light transmissive member. However, these problems can be solved by reducing the amount of resin to obtain a moderate irregularity shape.

The light transmissive member may be provided in the light emitting device by bonding the light transmissive member to the upper surface of the light emitting element before the light emitting element is mounted on the base body. Particularly, when the light emitting element is formed of a semiconductor laminate freed of a growth substrate of a semiconductor layer, for example, the light emitting element is bonded or fixed to a hard light transmissive member of glass, ceramic or the like to enhance the strength of the light emitting element, so that handling characteristics, reliability of mounting of the light emitting element, and so on can be improved.

(Dimensional Relationship of Light Emitting Device)

Figure 5A:
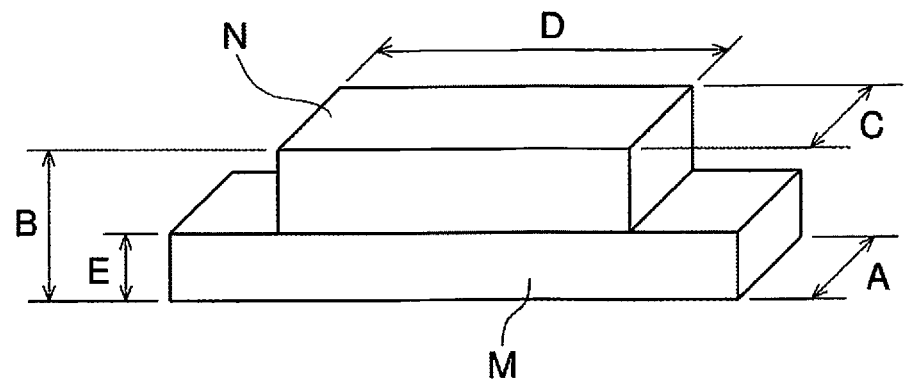
FIG. 5A is a schematic perspective view of the light emitting device for explaining a dimensional relationship of the light emitting device of the embodiment of the present invention.
Figure 5B:
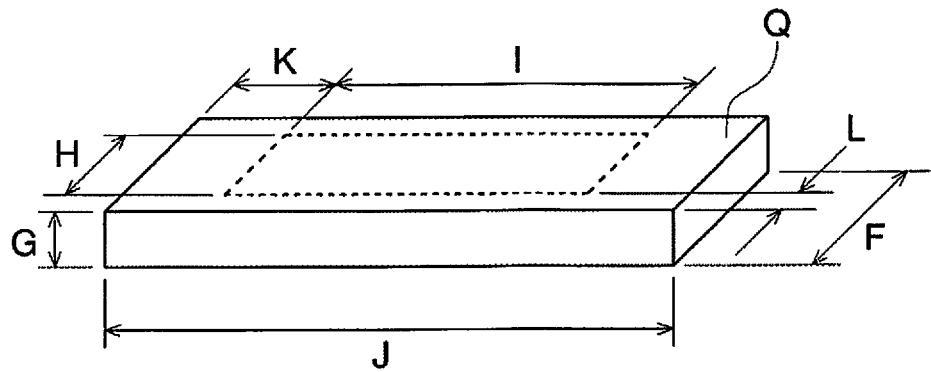
FIG. 5B is a schematic perspective view of a light transmissive member for explaining a dimensional relationship of the light emitting device of the embodiment of the present invention.

From another point of view, for example, where for example, in a light emitting element section (including a light emitting element, a sealing member and a light transmissive member) N carried on a base body M, the thickness of the base body M is E;

the length of the base body M in the short direction is A;

the total height of the base body M and the light emitting element N is B;

the length of the light emitting element section N (light transmissive member Q) in the short direction is C (=F); and the length of the light emitting element section N (light transmissive member Q) in the long direction is D (=J) as shown in FIGS. 5A and 5B, the light emitting device of the present invention preferably satisfies the following requirements:

$$B \geq A \quad (1)$$

$$D \geq C \quad (2)$$

$$A \geq C \quad (3)$$

$$E \geq A \quad (4).$$

Accordingly, when the side surface of the light emitting device of the present invention in the long direction is a mounting surface (side surface mounting), stability can be secured. Particularly, by satisfying the requirement (1), side surface mounting is facilitated. By satisfying the requirement (2), a more stable structure is obtained when side surface mounting is performed. By satisfying the requirement (3) and separating the mounting surface from the side surface of the sealing member in the long direction, solder can be prevented from penetrating in the light emitting element direction during mounting. Also, the light emitting device can be stably held on a mounting substrate on the side surface of the base body M in the long direction. By satisfying the requirement (4), stable mounting can be performed. By combining the requirements (1) to (4), further stable side surface mounting can be performed. Side surface mounting may be facilitated by, for example, forming a through-hole in the base body of the light emitting device and embedding therein a metal etc. having a high specific gravity to decenter the center of gravity. Further, side surface mounting may be ensured by making use of surface tension of solder by control of the shape of a solder fillet. One or more of these requirements may be arbitrarily combined.

Where in the light transmissive member Q that forms a part of the light emitting element N, the thickness of the light transmissive member Q is G;

the length of the light transmissive member Q in the short direction is F;

the length of the light transmissive member Q in the long direction is J;

the length of the upper surface of the light emitting element in the short direction is H;

the length of the light emitting element in the long direction is I; the width from the end face extending in the long direction of the sealing member to the end face extending in the long direction of the light emitting element is L; and the width from the end face extending in the short direction of the sealing member to the end face extending in the short direction of the light emitting element is K as described in FIG. 5B, the light emitting device preferably satisfies the following requirements:

side surface light emission area: $2 \times \{G \times (F+J)\}$, upper surface light emission area: $F \times J$ $G \leq 100$ μm, preferably $G \leq 50$ μm  (5); and $F \times J \geq 2 \times \{G \times (F+J)\}$  (6).

The present light emitting device is principally a side view type light emitting device, and light can be made incident to a light guide plate used for a liquid crystal backlight in particular. Thus, it is important to control distribution of light to increase the front surface luminance. Therefore, it is preferred to satisfy the requirement (6). Accordingly, upper surface light emission of the light transmissive member of the light emitting device can be intensified, so that light emission efficient for backlight use can be obtained. By providing the light transmissive member only just above the light emitting element I×H shown by a dotted line in FIG. 5B and sealing the outer periphery with a light shielding sealing resin, the luminous flux of the front surface is further increased, so that efficiency of incidence to the light guide plate can be enhanced.

Figure 5C:
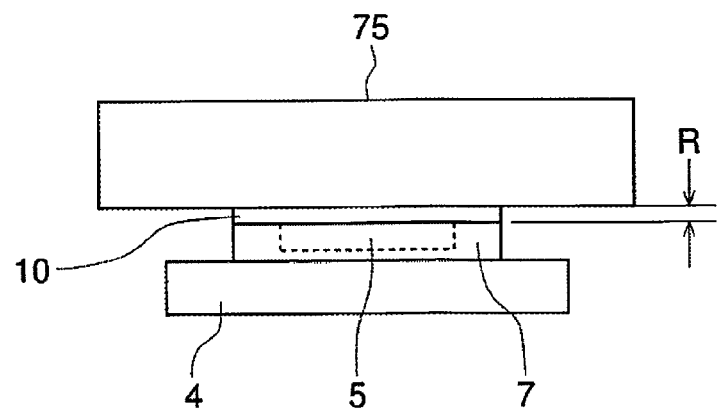
FIG. 5C is a schematic view showing a positional relationship between the light emitting device of the embodiment of the present invention and a light guide plate.

Further, when the light emitting device is used in backlight applications, it is preferred that the distance R between the upper surface of a light emitting element 5 and a light guide plate 75 is made shorter in a configuration in which the upper surface of a light transmissive member 10 is bonded to the light guide plate 75 as shown in FIG. 5C. The distance R between the upper surface of the light emitting element 5 and the light guide plate 75 is preferably about 100 μm or less, more preferably about 40 to 100 μm. When a phosphor is not contained, the distance R is preferably about 10 μm or less. In this case, the upper surface of the light transmissive member 10 may be a substrate made of sapphire or the like, or may be a coating layer obtained by coating a substrate of sapphire or the like or a nitride semiconductor layer. Preferably, the distance R satisfies the above-described distance over the entibackea of the light emitting surface. When the extremely thin light transmissive member 10 is disposed on the upper surface of the light emitting element 5, light scattering between the upper surface of the light emitting element 5 and the light guide plate 75 can be minimized. When the light transmissive member 10 is a quantum dot phosphor or transparent phosphor plate which has small internal light scattering, the luminance of the upper surface can be further increased. By reducing the distance between the light emitting element 5 and the light guide plate 75 as described above, efficiency of incidence of light to the light guide plate can be improved.

Hereinafter, embodiments of the light emitting device of the present invention will be described with reference to the drawings.

Embodiment 1

Figure 1B:
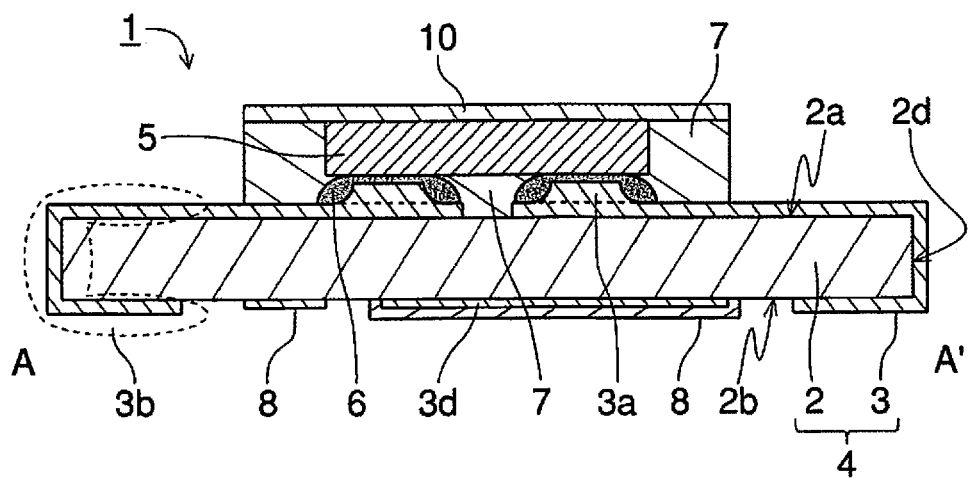
FIG. 1B is a cross section along the A-A' line of the light emitting device in FIG. 1A.
Figure 1C:
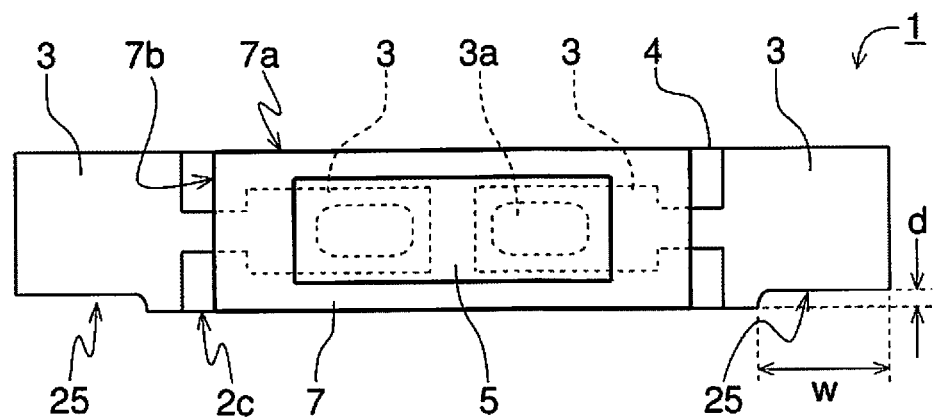
FIG. 1C is a simplified, see-through oblique view of the light emitting device in FIG. 1A.

As shown in FIGS. 1A to 1C, the light emitting device 1 in this embodiment is constituted by the base body 4, the light emitting element 5, and the sealing member 7. The base body 4 has the base material 2 and the connection terminals 3. The base material 2 includes a first main face 2a having a lengthwise direction and a short-side direction that is perpendicular to said lengthwise direction, a second main face 2b on the opposite side from the first main face 2a, and first end face 2c that extends in the lengthwise direction, and a second end face 2d that extends in the short-side direction. The connection terminals 3 consist of at least a positive and negative pair, and are provided on the first main face 2a of the base material. The connection terminals 3 are formed by laminating Cu/Ni/Au (total thickness: 20 μm, linear expansion coefficient: about 20 ppm/° C.) from the base material 2 side, and are formed on a surface of the base material 2, i.e. an upper surface as a first main surface 2a, an end face (a second end face) 2d extending in the short direction and a lower surface as a second main surface 2b. The base body 4 has a length of 1.8 mm in the long direction, a width of 0.3 mm in the short direction and a thickness of 0.45 mm, and functions as a wiring substrate. The strength of the base body is 300 MPa or more as measured by a tensile strength tester.

The base material 2 is composed of a BT resin composition containing a naphthalene-based epoxy resin containing a commercially available glass cloth (HL832NSF type LCA manufactured by Mitsubishi Gas Chemical Company, Inc.). The base material 2 contains glass fibers, spherical silica, spherical silicone and carbon, and has a rectangular parallelepiped shape. The base material 2 is substantially rectangular parallelepiped shape by excluding a recess 25 to be described below. The linear expansion coefficient of the base material 2 (without connection terminals) is about 3 ppm/° C., and the glass transition temperature of a resin that forms the base material 2 is about 280° C.

A pair of connection terminals 3 are close to each other at the central part of the base material 2 on the first main surface 2a side, and each have a projection pattern 3a as an element connection section. The projection pattern 3a can be formed from a layer composed of copper (projection thickness: 20 μm) by plating using a mask. The projection patterns 3a are each situated at a position opposite to a corresponding one of a pair of electrodes formed on the light emitting element 5 to be described below, and have a size equivalent to that of the electrode. A pair of connection terminals 3 are each continuously formed so as to extend in the long direction from the projection pattern 3a as an element connection section and pass along the first main surface 2a and the second end face 2d to the second main surface 2b of the base material 2. In the connection terminal 3, a region continuously extending from the projection pattern 3a as an element connection section to the second main surface 2b of the base material 2 (U-shaped region in cross-sectional view) is an external connection section 3b (see FIG. 1B). The edge of the connection terminal 3 extending along the long direction coincides with the edge of the base body 4 extending along the long direction, and the end face of the connection terminal 3 extending along the long direction forms the same plane with the end face of the base body 4 extending along the long direction.

The connection terminal 3 has a width-reduced region between the projection pattern 3a and the external connection section 3b (see FIG. 1C)

A part of a width-reduced region and an external connection section 3b of a connection terminal 3 is exposed from a sealing member 7 on both sides of the sealing member 7 on a base body 4 at the first main surface 2a of the base material 2. On the second main surface 2b side of the base material 2, a metal layer 3d is disposed for reinforcement and release of heat etc. in a region where the connection terminal 3 is not disposed. Two insulating films 8 are formed in a region including the top of the metal layer 3d. Two of the insulating films 8 have different sizes, and can be made to function as a mark for easily distinguishing the anode and the cathode of the light emitting device.

The light emitting element 5 is installed on the first main face 2a of the base body 4, and is connected to the connection terminals 3. That is, one light emitting element 5 is flip-chip-mounted on the projection pattern 3a of the connection terminal 3. The light emitting element 5 has a nitride semiconductor laminate (thickness: about 8 to 12 μm) formed on a sapphire substrate (thickness: about 150 μm), and includes a pair of positive and negative electrodes on a surface opposite to the sapphire substrate of the laminate. In the light emitting element 5, each of the pair of positive and negative electrodes is connected to a corresponding one of the projection patterns 3a of a pair of connection terminals 3 of the base body 4 by a meltable bonding member 6 (thickness: 20 μm) that is Au—Sn eutectic solder. The meltable bonding member 6 substantially completely cover the projection patterns 3a. The surface of the sapphire substrate has irregularities (height: 0.5 μm, pitch: 10 μm), and therefore the corresponding surface of the nitride semiconductor laminate also has irregularities associated therewith. By using these projection patterns 3a of the connection terminals, penetration of the bonding member into an unintended region can be prevented by performing quantitative control of the meltable bonding member 6 along with the shape and position of the projection patterns during mounting of the light emitting element. As a result, the light emitting element is aligned to an intended region with high accuracy, so that the light emitting element 5 can be fixed in the right place.

The light emitting element 5 is a rectangular parallelepiped-shaped LED chip which has a length of 0.9 mm in the long direction, a width of 0.2 mm in the short direction and a thickness of 0.15 mm and emits blue light (light emission peak wavelength: 455 nm). The surface roughness Ra of the side surface of the light emitting element 5 is 1.0 μm or less.

The sealing member 7 is molded in substantially a rectangular parallelepiped shape having a length (full length) of 1.2 mm in the long direction, a width (full length) of 0.3 mm in the short direction and a thickness of 0.15 mm. Edges of the sealing member 7 extending along the long direction coincides with edges of the base body 4 extending along the long direction. The sealing member 7 is provided on the first main surface of the base body 4 so as to be in contact with the light emitting element 5 such that the sealing member 7 covers the whole circumference of the side surface of the light emitting element 5 in contact therewith. The sealing member 7 is also provided on a surface of the light emitting element 5 opposite to the base body 4. That is, the sealing member 7 is disposed between the light emitting element 5 and the meltable bonding member 6 substantially completely covering the projection patterns 3a, and substantially completely covers the surface of the meltable bonding member 6. Further, the sealing member 7 may be provided between the light emitting element 5 and the base body 4. Accordingly, light can be efficiently extracted from the light emitting element 5 to the upper surface. Since the sealing member 7 is also provided on a surface of the light emitting element 5 opposite to the base body 4, the light emitting element 5 can be more strongly connected to the base body 4. The upper surface of the sealing member 7 substantially coincides with the upper surface of the light emitting element 5.

The sealing member 7 is formed of a silicone resin containing silica having an average particle size of 14 μm and titanium oxide having an average particle size of 0.25 to 0.3 μm as inorganic particles in amounts of 2 to 2.5 wt % and 40 to 50 wt %, respectively, based on the total weight of the sealing member 7. The silicone resin has a glass transition temperature of 40° C. and a linear expansion coefficient of about 50 ppm/° C. The edge of the sealing member 7 extending along the long direction coincides with the edge of the base body 4 extending along the long direction, and the end face of the sealing member 7 extending along the long direction forms the same plane with the end face of the base body 4 extending along the long direction.

The light transmissive member 10 (thickness: 20 μm) is disposed on the light emitting element 5, i.e. a surface on a side opposite to a pair of positive and negative electrodes. The light transmissive member 10 is formed by laminating 3 layers of silicone resin containing a phosphor of YAG: Ce having a central particle size of about 8 μm using a pulse spraying method. The light transmissive member 10 covers the upper surface of the sealing member 7. The end face of the light transmissive member 10 coincides with the end face of the sealing member 7.

In this light emitting device, a base body carrying a light emitting element has an extremely low linear expansion coefficient, and therefore a difference in linear expansion between the light emitting element and the base body due to heat applied during and after the production process can be kept extremely low. Accordingly, peeling between the light emitting element and the base body or application of undesired stress on the light emitting element, which results from a difference in linear expansion between the light emitting element and the base body, can be prevented, so that electric connection can be secured. As a result, a light emitting device having a long life and excellent characteristics can be obtained.

As described above, the base material that forms the base body is formed of a resin having a high glass transition temperature of 250° C. or higher and having a small linear expansion coefficient. This resin contains an inorganic filler such as $SiO_2$, $Al_2O_3$ or a glass cloth, and optionally carbon black having heat releasability, a silicone filler that imparts an elastic modulus, and so on at a high ratio. Accordingly, heat generated by driving of the light emitting element can be efficiently released. Particularly, when the resin is used for a base material stained black with carbon black or the like, heat can be efficiently released by heat radiation because the emissivity of a far infrared ray etc. is high. When the a surface of the base body which is in contact with the sealing member is coated with a material having a high heat absorptivity, a material having a low heat absorptivity of an electromagnetic wave in a visible range, a material that absorbs an electromagnetic wave having a long wavelength, such as a far infrared ray, or a material having a high heat conductivity, heat releasability can be further enhanced. Accordingly, heat releasability of a small light emitting device can be improved, efficiency of wavelength conversion of light by a phosphor can be improved, and luminous efficiency of the light emitting element can be improved.

The first end face 2c of the base material has a recess 25 that is contiguous with the first main face 2a and the second end face 2d and/or is contiguous with the second main face 2b and the second end face 2d. The length (width) w of this recess 25 in the lengthwise direction is greater than the depth d in the short-side direction. The connection terminals 3 are provided extending over the recess 25. The recess 25 is provided on both sides in the lengthwise direction of the base material 2, but only one side is discussed herein, and the other side will be considered to be the same and will not be described.

Because the recess 25 is formed in this way, the connection terminals 3 (the external connection sections 3b) can be provided extending to the first end face 2c side, which is the splitting end face of the base body 4. Thus, this increases the soldered surface area of the base body 4, and increases the soldering strength of the light emitting device 1. In addition, the recess 25 is formed longer in the lengthwise direction of the base material 2, and shorter (shallower) in the short-side direction of the base material 2, which maintains the mechanical strength of the base body (and particularly the end), and reduces cracking or chipping of the base material 2.

Therefore, good soldering strength can be obtained while maintaining the mechanical strength of even a thin base body 4.

The connection terminals 3 are provided extending over the second end face 2d. This allows a solder fillet to be formed on the side faces of the light emitting device 1, and further increases the soldering strength of the light emitting device 1. It is even better when the connection terminals 3 are provided extending over the second main face 2b via the second end face 2d.

The recess 25 is contiguous with the first main face 2a and the second main face 2b. This better allows the molten solder to spread out and wet the area between the recess 25 and the mounting substrate (the mounting substrate 51 discussed below), and tends to improve the soldering strength of the light emitting device 1. This configuration can be formed by having a second groove 15b (discussed below) pass through from the first main face 2a to the second main face 2b. The recess 25 can also be made contiguous with just either the first main face 2a or the second main face 2b by having the second groove 15b (discussed below) not pass all the way through. In addition, the recess 25 can be formed so as to have a concave component by forming the second groove 15b (discussed below) so that it bends in the shape of a wavy line, for example. A plurality of recesses 25 may be provided on each of both sides in the lengthwise direction of the base material 2, but it is preferable to provide just one each on both sides in the lengthwise direction of the base material 2.

The depth d in the short-side direction of the recess 25 is, for example, 0.25 mm or less, preferably 0.1 mm or less, and more preferably 0.05 mm or less. When the depth d in the short-side direction of the recess 25 is within this range, it will be easier to maintain the mechanical strength of the base body 4, and there will tend to be less cracking and chipping of the base material 2. In particular, when the depth d in the short-side direction of the recess 25 is 0.02 mm or less, the molten solder can wet and spread out between the recess 25 and the mounting substrate (the mounting substrate 51 discussed below) through capillary action. The lower limit to the depth d in the short-side direction of the recess 25 is, for example, 0.005 mm or more. The length w in the lengthwise direction of the recess 25 is, for example, at least 0.05 mm and no more than 0.3 mm, preferably at least 0.1 mm and no more than 0.25 mm, and more preferably at least 0.1 mm and no more than 0.2 mm. The recess 25 and the connection terminals 3 that extend over it are preferably separated from the sealing member 7.

The ratio of the depth d in the short-side direction to the length w in the lengthwise direction of the recess 25 is preferably no more than 0.5, more preferably no more than 0.25, and even more preferably no more than 0.2. The ratio of the depth d in the short-side direction to the width (maximum width) of the base body in the short-side direction of the base material 2 is preferably no more than 0.5, more preferably no more than 0.25, and even more preferably no more than 0.2. Forming the recess 25 in a shape such as this makes it easier to maintain the mechanical strength of the base body 4 and makes it less likely that the base material 2 will crack or chip.

The width (maximum width) of the base body in the short-side direction of the base material 2 is preferably no more than 0.5 mm, more preferably no more than 0.4 mm, and even more preferably no more than 0.3 mm. When the width in the short-side direction of the base body 4 is within this range, the light emitting device 1 can be made thin, and the recess 25 will tend to have an effect.

The recess 25 may be provided to both of the end faces extending in the lengthwise direction, but providing it to just one of the pair of end faces extending in the lengthwise direction is preferable from the standpoint of maintaining the mechanical strength of the base body 4.

Figure 2:
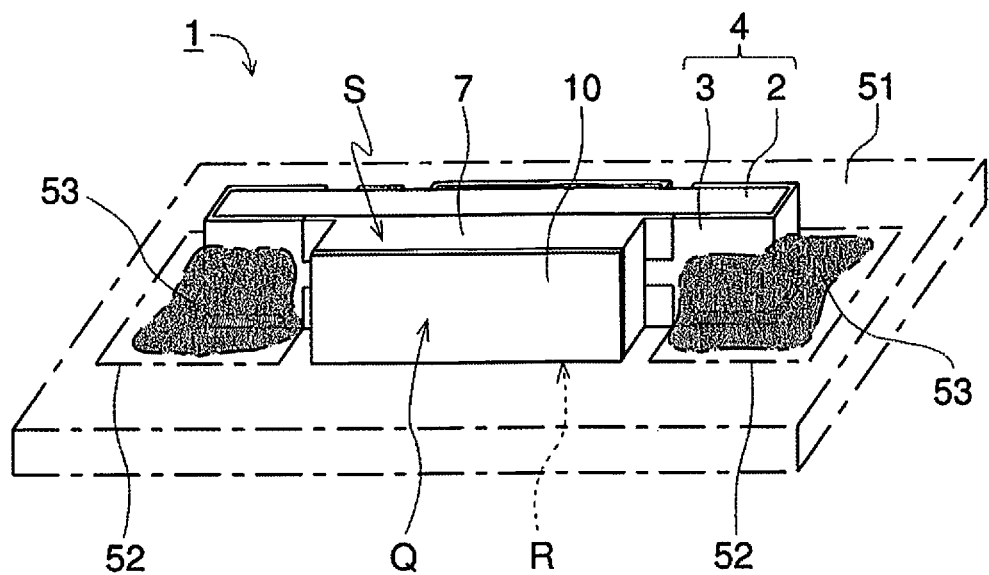
FIG. 2 is a simplified oblique view of the state when the light emitting device in FIG. 1A has been mounted on a mounting substrate.

In the light emitting device 1, each of a pair of end faces of the base body 4 extending along the long direction is disposed to form the same plane with a corresponding one of a pair of end faces of the sealing member 7 extending along the long direction as shown in FIG. 2. The light emitting device is mounted as a side view type on a mounting substrate 51 having a wiring pattern 52 on a surface thereof with one of the end faces which form the same planes as a mounting surface of the light emitting device 1. In mounting, a pair of external connection sections 3b of the light emitting device 1 are placed on wiring patterns 52 corresponding to a positive electrode and a negative electrode of the mounting substrate 51, and connected thereto by a solder 53. The solder 53 is connected such that the contact area with the small connection terminal 3 is enlarged over not only the first main surface but also the end face and the second main surface of the base body 4 at the external connection section 3b curved in a U shape. Accordingly, a solder fillet can be formed on the side surface of the light emitting device, so that heat releasability and mounting stability of the light emitting device can be improved. The solder 53 is also provided between the recess 25 and the mounting substrate 51, and in contact with the connection terminal 3 formed on the recess 25. This increases a contact area of the light emitting device 1 and the solder 53, and improves more heat releasability of the light emitting device and mounting stability.

By disposing a width-reduced region between the projection pattern 3a and the external connection section 3b in the connection terminal 3, the solder 53 connected to the external connection section 3b or flux contained therein can be prevented from penetrating below the sealing member 7.

Further, both the end face of the sealing member extending along the long direction and the end face of the base body 4 extending along the long direction are in contact with a surface of the mounting substrate 51.

Figure 3A:
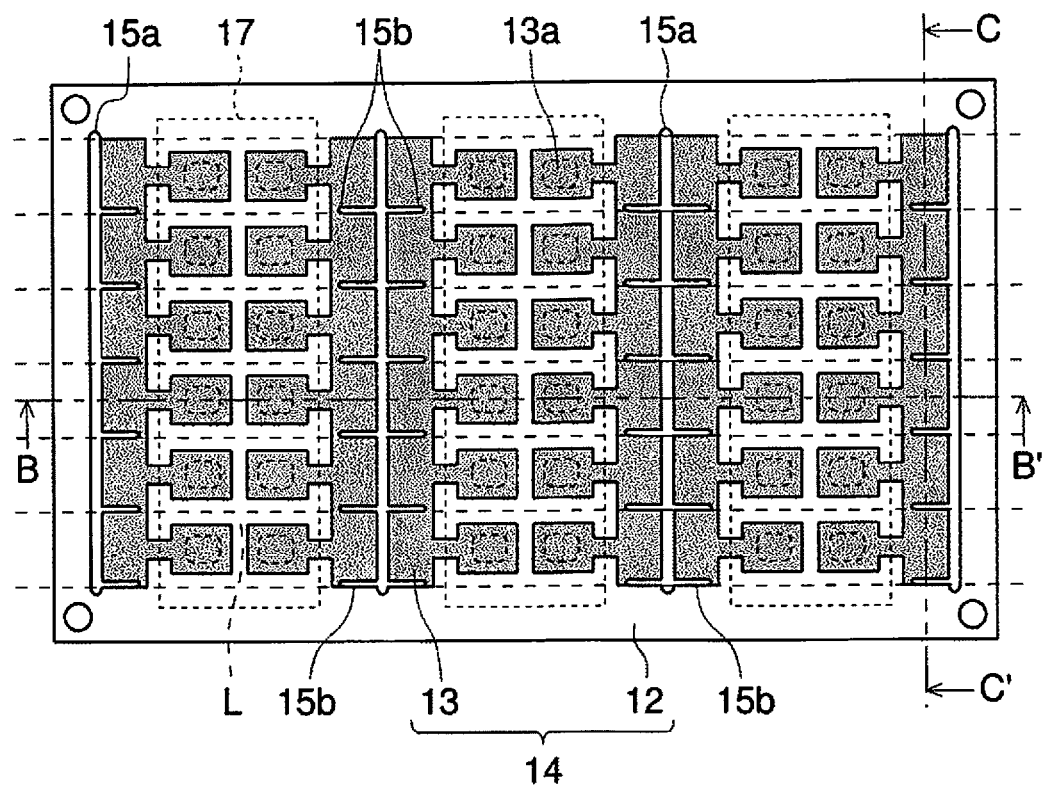
FIG. 3A is a simplified plan view illustrating a method for manufacturing the light emitting device in FIG. 1A.
Figure 3B:
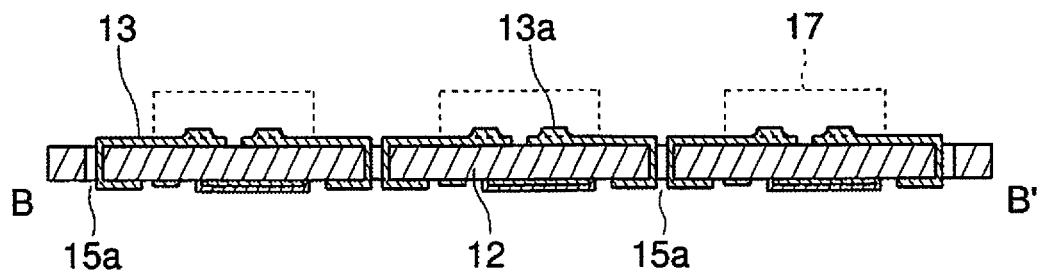
FIG. 3B is a cross section along the B-B' line in FIG. 3A.
Figure 3C:
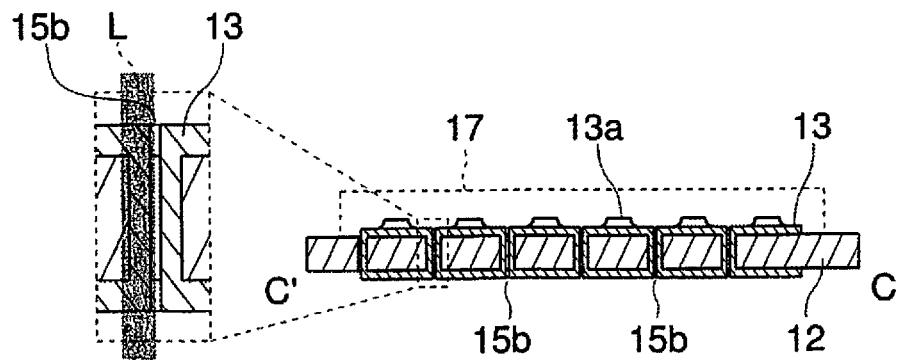
FIG. 3C is a cross section along the C-C' line in FIG. 3A.

The light emitting device 1 can be produced using a composite base body 14 with a composite connection terminal 13 formed on a base material 12 as shown in FIGS. 3A to 3C. The composite base body 14 is constituted by a plurality of linked pieces, each of which forms a substrate of a light emitting device after a dividing step. The composite base body 14 has a first groove 15a and the second groove 15b in a base material 12. The first groove 15a and the second groove 15b here are through-grooves (slits) that go from the top face to the bottom face (rear face) of the base material 12. The first groove 15a and the second groove 15b can be formed by mechanical cutting with an end mill or the like, laser irradiation, molding in a metal mold, laminating and sintering of a preformed sheet, or the like. The first groove 15a is a linear groove that extends in the longitudinal direction on the composite base body 14, and a plurality of these are provided substantially parallel to each other. The inner walls of the first grooves 15a constitute the second end face 2d of the base body of each light emitting device after they have been separated into units. The second groove 15b is a linear groove that extends in the lateral direction on the composite base body 14, and a plurality of these are provided substantially parallel to each other. The second grooves 15b are provided contiguously with the first grooves 15a. More precisely, the second grooves 15b intersect the first grooves 15a substantially at a right angle. The inner walls of the second grooves 15b constitute the recess 25 of the first end face 2c of the base body in each light emitting device after they have been separated into units. The second grooves 15b are provided in a rectangular shape (the corners may be rounded) that is longer in one direction in top view, for example. The second grooves 15b are preferably narrower than the first grooves 15a. The second grooves 15b are also preferably formed by laser irradiation because of its excellent precision. The composite connection terminals 13 are also provided to the inner walls of the first grooves 15a and the second grooves 15b. The composite connection terminals 13 are preferably provided so as to be contiguous from the top face to the bottom face of the base material 12 of the composite base body 14, through the inner walls of the first grooves 15a and the second grooves 15b. In FIGS. 3A to 3C, a composite base body 14 that yields 18 light emitting devices is shown, but a composite base body 14 that yields many more light emitting devices (hundreds or thousands) can be used to improve productivity.

The light emitting elements 5 are connected onto the composite base body 14, a plurality of sealing members 17 are molded in a batch by transfer molding so as to cover the end faces of the light emitting elements 5, and a molded article is taken out. Thereafter, the upper surface of the composite base body 14 exposed from the sealing member is masked, and the upper surface of the light emitting element 5 exposed from the upper surface of the sealing member 17 and the upper surface of the sealing member 17 are covered with the light transmissive member 10 by a pulse spraying method. Thereafter, the composite base body 14 and the sealing member 17 are cut in one direction along a division scheduled line L. Accordingly, because the slit 15 is disposed, the composite base body 14 is also separated in the extending direction of the slit, so that divided light emitting devices can be obtained with a relatively small number of man-hour. A dicer, a laser or the like can be used for cutting.

As shown in FIGS. 3A to 3C, the composite base body 14 is cut through the second grooves 15b, but the composite base body 14 is cut so that some of the inner walls of the second grooves 15b and the composite connection terminals 13 provided over them will remain in the various light emitting devices after they have been separated into units. For instance, the splitting line L made be shifted from the center line of the second grooves 15b and/or a cutting tool may be used that has a thickness (cutting width) that is less than the width of the second grooves 15b.

In this embodiment, the light transmissive member 10 is formed from the upper surface of the light emitting element 5 to the upper surface of the sealing member 17 using a pulse spraying method, but the light transmissive member 10 may be formed only on the upper surface of the light emitting element 5. The plate-shaped light transmissive member 10 having substantially the same shape as that of the light emitting element 5 in plan view may be bonded to the upper surface of the light emitting element 5, followed by forming the sealing member 17 so as to cover the end faces of the light emitting element 5 and the light transmissive member 10.

Embodiment 2

Figure 4A:
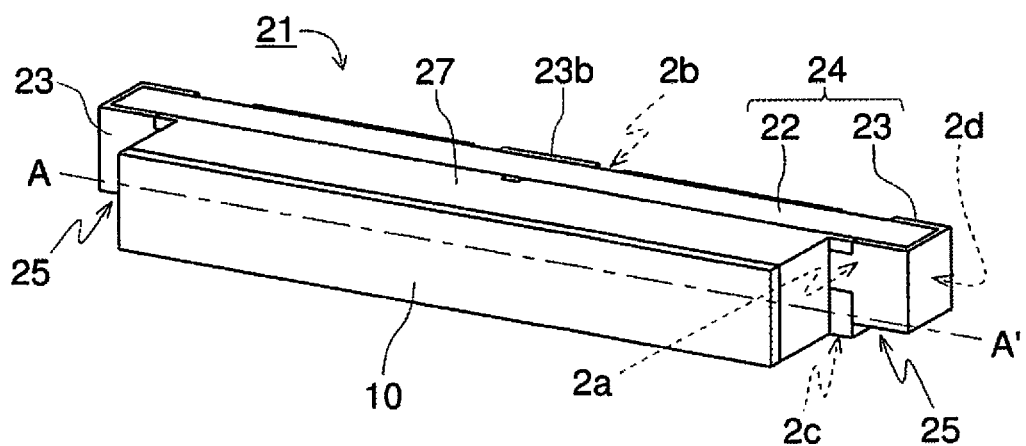
FIG. 4A is a simplified oblique view of the light emitting device in a modification example of an embodiment of the present invention.
Figure 4B:
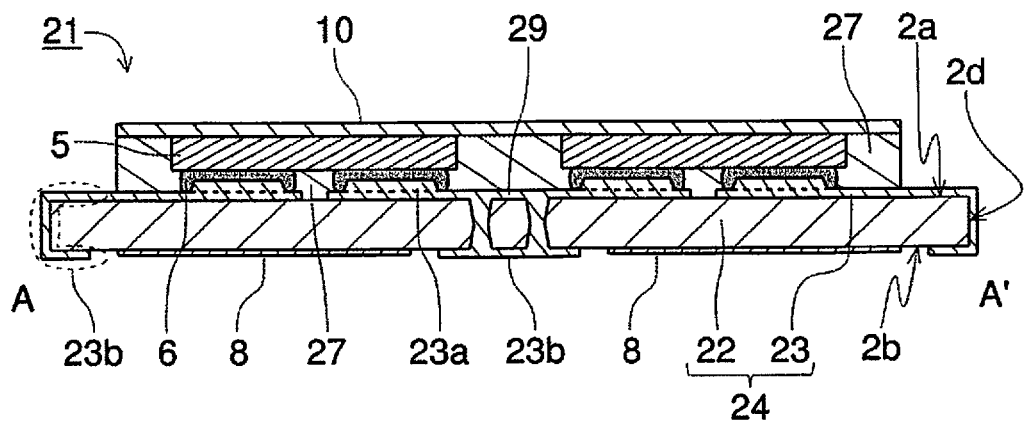
FIG. 4B is a cross section along the A-A' line of the light emitting device in FIG. 4A.
Figure 4C:
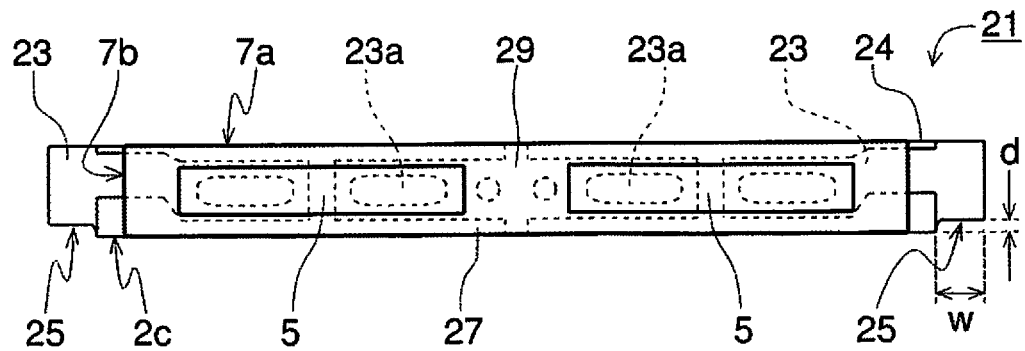
FIG. 4C is a simplified, see-through oblique view of the light emitting device in FIG. 4A.

As shown in FIGS. 4A to 4C, the light emitting device 21 in this embodiment is constituted by a base body 24 having connection terminals 23, a plurality of light emitting elements 5, and a sealing member 27. The connection terminals 23 are disposed extending to the top face, the end faces, and the bottom face on both sides in the lengthwise direction of a base material 22. On the top face of the base material 22 is further disposed a terminal 29 that allows the light emitting elements 5 to be connected serially, for example. On one face of the base body 24, the connection terminals 23 and the terminal 29 each have a protrusion pattern 23a serving as an element connection section, and on these protrusion patterns 23a, the light emitting elements 5 are flip-chip mounted with a fusible joining member 6.

The light emitting elements 5 are disposed so that they are arranged in a single line, but they need not be in a single line, and may instead be disposed in columns and rows.

The base material 22 has a through-hole between two light emitting elements 5, that is, in the approximate center in the lengthwise direction. The terminal 29 fills in this throughhole, and forms an external connection section 23b (second external connection section) over the second main face 2b of the base material 22. This second external connection section 23b increases the soldering strength of the light emitting device 21, and also functions as a terminal for heat dissipation. Two insulating films 8 are formed over the second main face 2b of the base material 22.

The sealing member 27 integrally seals these light emitting elements 5. The end faces extending in the lengthwise direction of the sealing member 27 are formed substantially in the same plane with the end faces extending in the lengthwise direction of the base body 24. The edge in the short-side direction of the sealing member 27 is disposed on the inside of the base body 24.

The light emitting device 20 has a configuration substantially similar to that in the first embodiment except for the configuration described above. Accordingly, the light emitting device 20 exhibits an effect similar to that in the first embodiment. Further, the light emitting device can be used as a side view type light emitting device in a linear form or matrix form. Therefore, the light emitting element can have improved mounting accuracy as compared to a case where individual side view type light emitting devices are each mounted on a mounting substrate. For example, as a backlight light source, the alignment property with a light guide plate can be improved.

When a plurality of the light emitting elements 5 are thus installed, it is easier to form the base body 24 in a long, slender shape, but with the above-mentioned recess 25, the soldering strength can be raised while maintaining the mechanical strength of the base body 24.

Figure 6A:
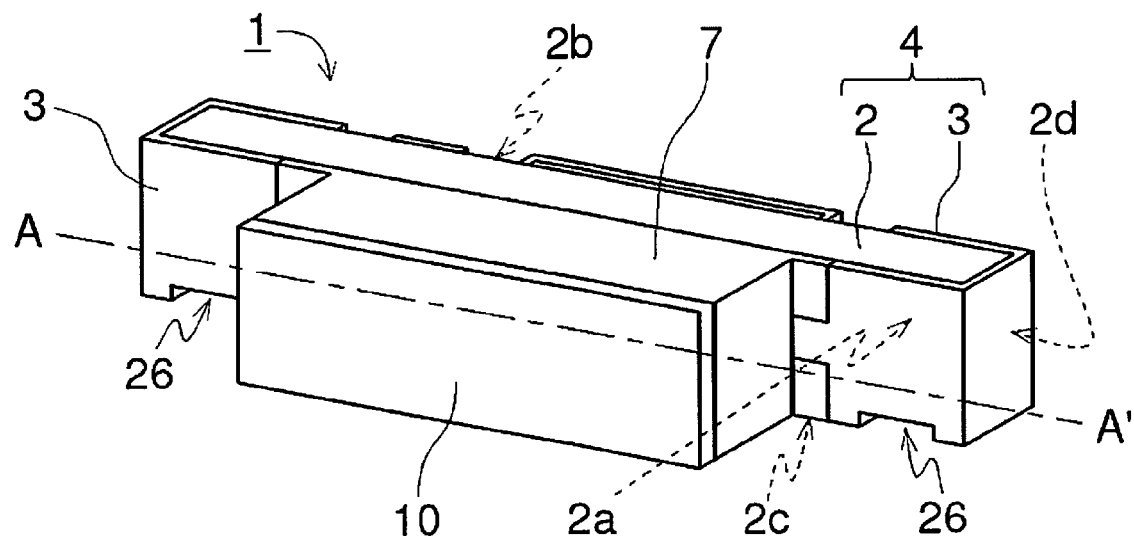
FIG. 6A is a simplified oblique view of the light emitting device in a modification example of an embodiment of the present invention.
Figure 6B:
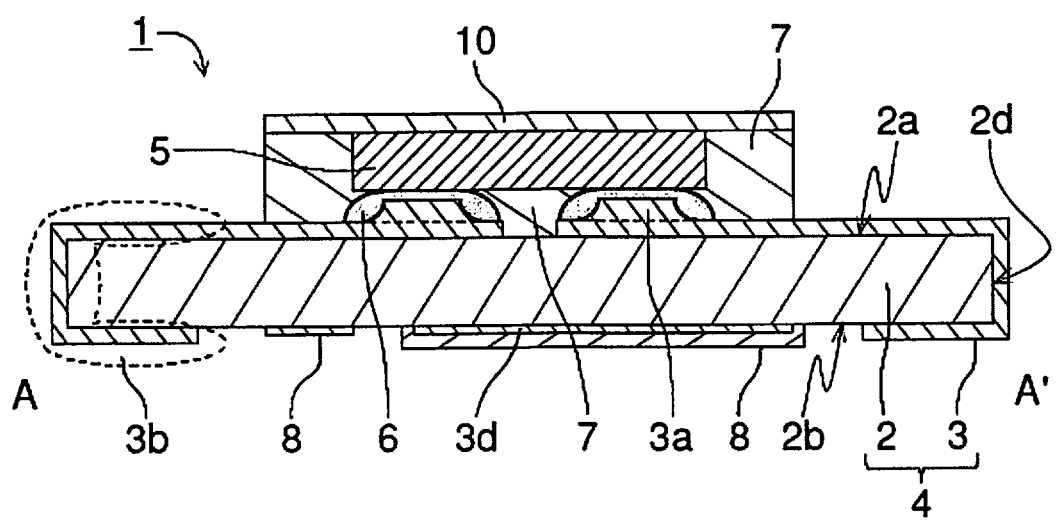
FIG. 6B is a cross section along the A-A' line of the light emitting device in FIG. 6A.
Figure 6C:
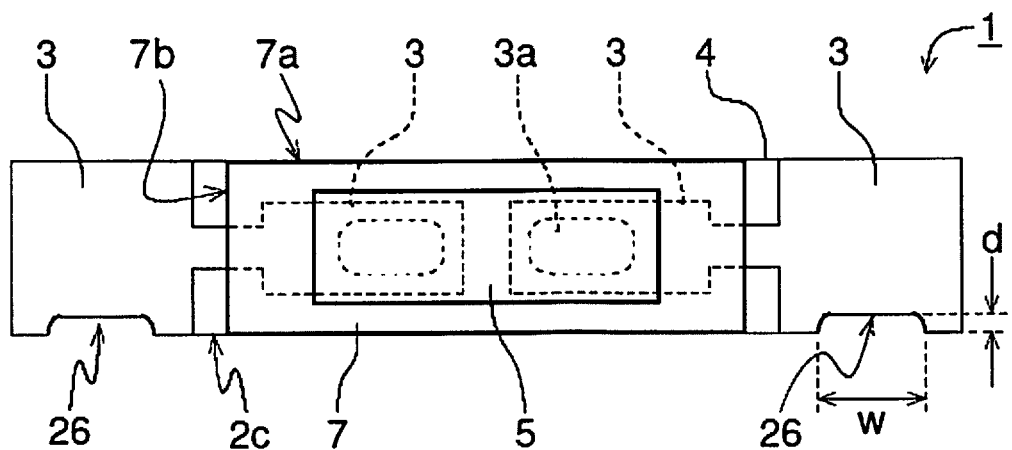
FIG. 6C is a simplified, see-through oblique view of the light emitting device in FIG. 6A.

An example was given in which the recess 25 was contiguous with the second end face 2d, but in a modification example, as shown in FIGS. 6A to 6C, a recess 26 provided to the first end face 2c of the base material 2 of the base body is contiguous with the first main face 2a and/or the second main face 2b, but is separated from the second end face 2d, and the connection terminals are provided extending over the recess 26. Consequently, the corners of the base material 2 of the base body will not be chipped, and the ends in the lengthwise direction of the base body will not become thin, while the soldering strength of the light emitting device can be increased. Also, this makes it less likely that the light emitting devices will be mounted in an erect posture (manhattanization). Here again, the recess 26 preferably has a length in the lengthwise direction that is greater than the depth in the short-side direction, and it is similarly preferable in other preferred embodiments pertaining to the recess 25 given above, but is not limited to these. With the manufacturing method in this embodiment, the second grooves 15b may be provided separated from the first grooves 15a.

INDUSTRIAL APPLICABILITY

The light emitting device of the present invention can be used for backlight light sources of liquid crystal displays, various kinds of lighting fixtures, and various kinds of display devices such as large displays, advertisements and destination guides, and image reading devices in digital video cameras, facsimiles, copiers, scanners and the like, and projector devices.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising;
a base body having
   a base material that includes a first main face that has a lengthwise direction and a short-side direction that is perpendicular to the lengthwise direction, a second main face on the opposite side from the first main face, a first end face that extends in the lengthwise direction, and a second end face that extends in the short-side direction, and
   connection terminals that are provided on the first main face of the base material; and
a light emitting element that is installed on the first main face and is connected to the connection terminals,
the first end face of the base material has a recess that is contiguous with the first main face and the second end face and/or is contiguous with the second main face and the second end face,
a length of the recess in a lengthwise direction is greater than a depth in a short-side direction, and
the connection terminals are provided extending over the recess.

2. The light emitting device according to claim 1, wherein the connection terminals are provided so as to extend over the second end face of the base material.

3. The light emitting device according to claim 2, wherein the connection terminals are provided so as to extend to the top of the second main surface via the second end face of the base material.

4. The light emitting device according to claim 3, wherein the recess is contiguous with the first main face and the second end face.

5. The light emitting device according to claim 4, wherein a ratio of a depth in the short-side direction to a length in the lengthwise direction of the recess is no more than 0.5.

6. The light emitting device according to claim 1, wherein the recess is contiguous with the first main face and the second end face.

7. The light emitting device according to claim 1, wherein a depth in the short-side direction of the recess is 0.02 mm or less.

8. The light emitting device according to claim 1, wherein a ratio of a depth in the short-side direction to a length in the lengthwise direction of the recess is no more than 0.5.

9. The light emitting device according to claim 1, wherein a width in the short-side direction of the base material is no more than 0.5 mm.

10. The light emitting device according to claim 1, wherein the connection terminals are provided so as to extend to the top of the second main surface via the second end face of the base material.

11. A light emitting device comprising;
a base body having
   a base material that includes a first main face that has a lengthwise direction and a short-side direction that is perpendicular to the lengthwise direction, a second main face on the opposite side from the first main face, a first end face that extends in the lengthwise direction, and a second end face that extends in the short-side direction, and
   connection terminals that are provided on the first main face of the base material; and
a light emitting element that is installed on the first main face and is connected to the connection terminals,
the first end face of the base material has a recess that is contiguous with the first main face and/or the second main face and is separated from the second end face,
a length of the recess in a lengthwise direction is greater than a depth in a short-side direction, and
the connection terminals are provided extending over the recess.

12. The light emitting device according to claim 11, wherein the connection terminals are provided so as to extend over the second end face of the base material.

13. The light emitting device according to claim 12, wherein the connection terminals are provided so as to extend to the top of the second main surface via the second end face of the base material.

14. The light emitting device according to claim 13, wherein the recess is contiguous with the first main face and the second end face.

15. The light emitting device according to claim 14, wherein a ratio of a depth in the short-side direction to a length in the lengthwise direction of the recess is no more than 0.5.

16. The light emitting device according to claim 11, wherein the recess is contiguous with the first main face and the second end face.

17. The light emitting device according to claim 11, wherein a depth in the short-side direction of the recess is 0.02 mm or less.

18. The light emitting device according to claim 11, wherein a ratio of a depth in the short-side direction to a length in the lengthwise direction of the recess is no more than 0.5.

19. The light emitting device according to claim 11, wherein a width in the short-side direction of the base material is no more than 0.5 mm.

20. The light emitting device according to claim 11, wherein the connection terminals are provided so as to extend to the top of the second main surface via the second end face of the base material.

* * * * *